(12) United States Patent
Minato et al.

(10) Patent No.: US 8,247,937 B2
(45) Date of Patent: Aug. 21, 2012

(54) SEMICONDUCTOR MODULE AND ELECTRONIC CIRCUIT-INTEGRATED MOTOR DEVICE USING SAME

(75) Inventors: Hideki Minato, Nagoya (JP); Hideki Kabune, Nagoya (JP); Atsushi Furumoto, Nukata-gun (JP); Ayako Iwai, Chiryu (JP)

(73) Assignee: Denso Corporation, Kariya (JP)

( * ) Notice: Subject to any disclaimer, the term of this patent is extended or adjusted under 35 U.S.C. 154(b) by 176 days.

(21) Appl. No.: 12/822,403

(22) Filed: Jun. 24, 2010

(65) Prior Publication Data
US 2010/0327709 A1 Dec. 30, 2010

(30) Foreign Application Priority Data

Jun. 24, 2009 (JP) .................................. 2009-149648
Jan. 28, 2010 (JP) .................................. 2010-17451

(51) Int. Cl.
*H02K 11/00* (2006.01)
*H02K 9/00* (2006.01)
(52) U.S. Cl. ........................... 310/68 R; 310/71; 310/64
(58) Field of Classification Search ................ 310/68 D, 310/68 A, 68 R, 71; *H02K 11/00*
See application file for complete search history.

(56) References Cited

U.S. PATENT DOCUMENTS

| 5,119,466 | A * | 6/1992 | Suzuki | 388/831 |
| 5,633,542 | A * | 5/1997 | Yuhi et al. | 310/40 MM |
| 6,577,030 | B2 * | 6/2003 | Tominaga et al. | 310/68 B |
| 7,021,418 | B2 * | 4/2006 | Tominaga et al. | 180/444 |
| 7,206,204 | B2 * | 4/2007 | Nakatsu et al. | 361/703 |
| 7,498,669 | B2 * | 3/2009 | Kataoka | 257/688 |
| 7,561,429 | B2 * | 7/2009 | Yahata et al. | 361/715 |
| 2004/0090130 | A1 | 5/2004 | Kaneko et al. | |
| 2008/0136265 | A1 | 6/2008 | Mizukoshi et al. | |

FOREIGN PATENT DOCUMENTS

JP        10-234158        9/1998

(Continued)

OTHER PUBLICATIONS

JPO Machine Translation, JP 2000-092847, Semiconductor Module Apparatus with Capacitor, Feb. 2, 2012, http://dossier.ipdl.inpit.go.jp/text_trans.html.*

(Continued)

*Primary Examiner* — Quyen Leung
*Assistant Examiner* — Thomas Truong
(74) *Attorney, Agent, or Firm* — Nixon & Vanderhye PC

(57) ABSTRACT

A V1 semiconductor module has a coil terminal, which is directly connectable to a lead wire of a coil. As a result, the number of parts required to connect electronic parts is reduced. Further, since no printed circuit board is required, the coil terminal can be shaped in any size without being limited in correspondence to the thickness of a copper film of the substrate. The coil terminal and control terminals, which are connected to the printed circuit board having a control circuit for controlling current supply to the coil, are provided on different wall surfaces of a resin part. Thus, the coil and the printed circuit board can be readily connected to the coil terminal and the control terminals, respectively, resulting in simplification of the device.

18 Claims, 28 Drawing Sheets

FOREIGN PATENT DOCUMENTS

| | | |
|---|---|---|
| JP | 10-322973 | 12/1998 |
| JP | 2000-092847 | 3/2000 |
| JP | 2002-048099 | 2/2002 |
| JP | 2002-345211 | 11/2002 |
| JP | 2004-023877 | 1/2004 |
| JP | 2004-152859 | 5/2004 |
| JP | 2004-236470 | 8/2004 |
| JP | 2005073373 A * | 3/2005 |
| JP | 2005-347561 | 12/2005 |
| JP | 2007-174759 | 7/2007 |
| JP | 2007-215299 | 8/2007 |
| JP | 2007-312523 | 11/2007 |
| JP | 2008-131794 | 6/2008 |
| JP | 2008-141140 | 6/2008 |
| JP | 2008-211945 | 9/2008 |
| WO | WO 2010/150527 | 12/2010 |
| WO | WO 2010/150528 | 12/2010 |
| WO | WO 2010/150529 | 12/2010 |
| WO | WO 2010/150530 | 12/2010 |

OTHER PUBLICATIONS

JPO Machine Translation, JP 2005-073373, Power Conversion Apparatus, Feb. 2, 2012, http://dossier.ipdl.inpit.go.jp/text_trans.html.*

JPO Machine Translation, JP 2005-347561, Power Semiconductor Module and Power Conversion Apparatus, Feb. 2, 2012, http://dossier.ipdl.inpit.go.jp/text_trans.html.*

JPO Machine Translation, JP 2007-312523, Power Module, Feb. 2, 2012, http://dossier.ipdl.inpit.go.jp/text_trans.html.*

Japanese Office Action dated Jun. 10, 2011, issued in corresponding Japanese Application No. 2010-017451 with English Translation.

U.S. Appl. No. 12/822,412, Minato et al, filed Jun. 24, 2010.
U.S. Appl. No. 12/822,396, Yamasaki et al, filed Jun. 24, 2010.
U.S. Appl. No. 12/822,614, Fujita et al, filed Jun. 24, 2010.
U.S. Appl. No. 12/822,635, Miyachi et al, filed Jun. 24, 2010.
U.S. Appl. No. 12/822,381, Iwai et al, filed Jun. 24, 2010.
U.S. Appl. No. 12/822,627, Yamasaki et al, filed Jun. 24, 2010.

* cited by examiner

SEMICONDUCTOR MODULE AND ELECTRONIC CIRCUIT-INTEGRATED MOTOR DEVICE USING SAME

CROSS REFERENCE TO RELATED APPLICATION

This application is based on and incorporates herein by reference Japanese Patent Applications No. 2009-149648 filed on Jun. 24, 2009 and No. 2010-17451 filed on Jan. 28, 2010.

FIELD OF THE INVENTION

The present invention relates to a semiconductor module and an electronic circuit-integrated motor device using the semiconductor module.

BACKGROUND OF THE INVENTION

In a conventional electric motor, phase coils wound on a stator is energized by electric currents to generate a rotating magnetic field so that a rotor is rotated by the rotating magnetic field. For driving the motor, the phase currents for energizing the phase coils are switched over by switching elements as exemplified in the patent document (JP 2002-345211-A). According to the patent document, a semiconductor module including the switching elements for switching over the coil currents are provided on a printed circuit board. The semiconductor module is connected to electronic parts such as the phase coils of the motor and capacitors through a wiring pattern formed on the printed circuit board. Copper films, which form the wiring pattern on the printed circuit board, are normally very thin, for example, as thin as less than 100 µm. In connecting the semiconductor module with the coils or the capacitors through the printed circuit board, the printed circuit board is required to provide a large area thereon so that required large currents may be supplied. It is thus difficult to reduce the entire size of such an apparatus.

SUMMARY OF THE INVENTION

It is therefore an object of the present invention to provide a semiconductor module and an electronic circuit-integrated motor device, in which an electronic circuit using the semiconductor module is incorporated.

According to the present invention, a semiconductor module for driving a motor includes a semiconductor chip, a land, a resin part, a coil terminal and control terminals. The semiconductor chip includes switching elements that switches over supply of a current to a coil of the motor in driving the motor. The land mounts the semiconductor chip thereon. The resin part seals and encapsulates the semiconductor chip and embeds the land therein. The coil terminal is protruded from the resin part and directly connectable to the coil. The control terminals are protruded from the resin part and connectable to a printed circuit board, which includes a control circuit for controlling the supply of current to the coil. The coil terminal and the control terminals are provided on different wall surfaces of the resin part.

The above-described semiconductor module is provided in a motor device, which includes a motor case formed in a tubular shape, a stator fixed to a radially inside wall surface of the motor case and having coils wound thereabout to form a plurality of phases, a rotor arranged radially inside the stator, and a shaft rotatable with the rotor.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 4:
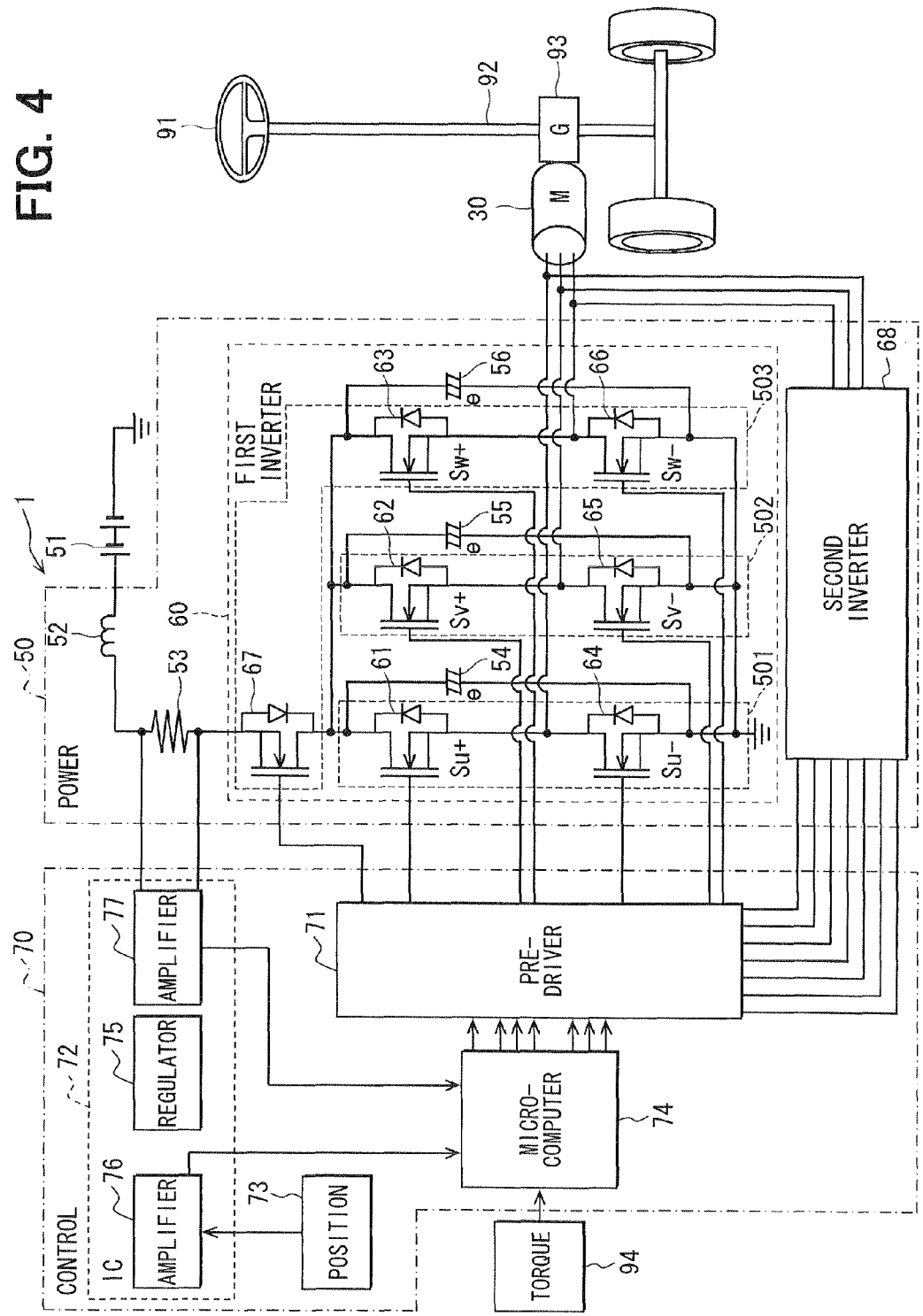
FIG. 4 is a circuit diagram of an electric power steering system.

An electronic circuit-integrated motor device according to the first embodiment is provided for an electric power assist system such as an electric power steering system (EPS system), which is a power assist system exemplified in FIG. 4.

Referring first to FIG. 4, an electronic circuit-integrated motor device 1 includes a motor 30, a power circuit 50 and a control circuit 70. The electronic circuit-integrated motor device 1 provides steering assist to a steering wheel 91 of a vehicle by generating a rotary torque for a column shaft 92 through a gear 93 mounted on the column shaft 92, which is a rotating shaft of the steering wheel 91. More specifically, when the steering wheel 91 is operated by a driver, a torque sensor 94 detects a steering torque that is generated for the column shaft 92 as a result of steering. Further, a vehicle speed signal is acquired from a CAN (control area network), which is not shown, to provide steering assist to a driver who steers the steering wheel 91. The use of the this mechanism, depending on the employed control method, will make it possible not only to provide steering assist, but also to provide automatic control of operations of the steering wheel 91 for the purpose, for instance, of causing the vehicle to stay in a traffic lane on an expressway or guiding the vehicle into a parking space in a parking lot.

The motor 30 is a brushless motor that rotates the gear 93 in a normal direction and in a reverse direction. The power circuit 50 supplies electrical power to the motor 30. The power circuit 50 includes a choke coil 52, which is positioned in a power supply cable from a power source 51, a shunt resistor 53, aluminum electrolytic capacitors 54, 55, 56, and a set of two inverter circuits, that is, a first inverter circuit 60 and a second inverter circuit 68. As the first inverter circuit 60 and the second inverter circuit 68 have substantially the same circuit configuration, the first inverter circuit 60 will be mainly described below.

The first inverter circuit 60 includes seven metal oxide semiconductor field effect transistors (MOSFETs) 61, 62, 63, 64, 65, 66, 67, which are classified as one of a variety of types of field effect transistors. The MOSFETs 61 to 67 are switching elements. More specifically, the path between the source and drain of each MOSFET turns on (closes) or off (opens) depending on the electric potential applied to the gate.

The MOSFETs 61 to 67 are hereinafter referred to as FETs 61 to 67, respectively. The FETs 61 to 66 may be individually referred to as the FET (Su+) 61, FET (Sv+) 62, FET (Sw+) 63, FET (Su−) 64, FET (Sv−) 65, and FET (Sw−) 66. The FET 67 closest to the power source 51 is provided to protect the FETs 61 to 66 of the power circuit 50 from reverse connection of the power source 51. More specifically, the FET 67, which is connected in a direction opposite to that of the FETs 61 to 66, serves as a power relay that prevents an electrical current from flowing in a reverse direction when the power source 51 is erroneously connected in polarity.

The remaining six FETs 61 to 66 are described below. The FETs 61 to 66 are switching elements that change coil currents flowing to multiple-phase coils for driving the motor 30, that is, three-phase windings.

The gates of the FETs 61 to 66 are connected to six output terminals of, a pre-driver circuit 71.

The drain of the FET (Su+) 61 is connected to the power supply cable, and the source thereof is connected to the drain of the FET (Su−) 64. The drain of the FET (Sv+) 62 is connected to the power supply cable, and the source thereof is connected to the drain of the FET (Sv−) 65. The drain of the FET (Sw+) 63 is connected to the power supply cable, and the source thereof is connected to the drain of the FET (Sw−) 66.

The drain of the FET (Su−) 64 is connected to the source of the FET (Su+) 61, and the source thereof is connected to the ground (ground cable). The drain of the FET (Sv−) 65 is connected to the source of the FET (Sv+) 62, and the source thereof is connected to the ground. The drain of the FET (Sw−) 66 is connected to the source of the FET (Sw+) 63, and the source thereof is connected to the ground.

Three connection points (junctions) between the series-connected FETs among FETs 61 to 66 are respectively connected to a U-phase coil, a V-phase coil, and a W-phase coil of the motor 30. More specifically, the junction between the FET (Su+) 61 and the FET (Su−) 64 is connected to the U-phase coil, the junction between the FET (Sv+) 62 and the FET (Sv−) 65 is connected to the V-phase coil, and the junction between the FET (Sw+) 63 and the FET (Sw−) 66 is connected to the W-phase coil.

It is noted that the FETs 61, 62 are packaged as a semiconductor module 501, the FETs 62, 65 are packaged as a semiconductor module 502, and the FETs 63, 66, 67 are packaged as a semiconductor module 503.

The aluminum electrolytic capacitor 54 is connected in parallel between the power supply cable of the FET (Su+) 61 and the ground of the FET (Su−) 64. Similarly, the aluminum electrolytic capacitor 55 is connected in parallel between the power supply cable of the FET (Sv+) 62 and the ground of the FET (Sv−) 65. The aluminum electrolytic capacitor 56 is connected in parallel between the power supply cable of the FET (Sw+) 63 and the ground of the FET (Sw−) 66. Each of the aluminum electrolytic capacitors 54 to 56 are simply referred to as the capacitor.

The choke coil 52 is provided to reduce power supply noise. The capacitors 54 to 56 store electrical charge to assist the supply of electrical power to the FETs 61 to 66 and suppress a surge voltage and other electric noise components. Even when an erroneous power source connection is made, the capacitors 54 to 56 are not damaged or broken, because the FET 67 is provided in series between the power source 51 and the inverter circuit 60 to provide protection against reverse connection.

The shunt resistor 53 is used to detect the amount of current flowing to the series-connected FETs.

The control circuit 70 includes the pre-driver circuit 7, a customized integrated circuit (custom IC) 72, a position sensor 73 and a microcomputer 74. The custom IC 72 includes two functional blocks, that is, a regulator circuit 75, a position sensor signal amplifier circuit 76 and a detected voltage amplifier circuit 77.

The regulator circuit 75 is a stabilization circuit that stabilizes the power source voltage. The regulator circuit 75 stabilizes the supply of electrical power to various units. For example, the regulator circuit 75 ensures that the microcomputer 74 operates on a predetermined stabilized supply voltage (e.g., 5 V).

The position sensor signal amplifier circuit 76 inputs a signal from the position sensor 73. The position sensor 73 is provided in the motor 30 and outputs a rotational position signal of the motor 30. The position sensor signal amplifier circuit 76 amplifies the rotational position signal and outputs the amplified rotational position signal to the microcomputer 74.

The detected voltage amplifier circuit 77 detects a voltage across the shunt resistor 53 installed in the power circuit 50, amplifies the detected voltages indicative of the coil currents supplied to the motor 30, and outputs the amplified voltages to the microcomputer 74.

Consequently, the rotational position signal of the motor 30 and the voltages across the shunt resistor 53 are applied to the microcomputer 74. A steering torque signal is also applied to the microcomputer 74 from the torque sensor 94 mounted on the column shaft 92. In addition, the vehicle speed signal enters the microcomputer 74 through the CAN.

Upon receipt of the steering torque signal and the vehicle speed signal, the microcomputer 74 controls the inverter circuits 60, 68 through the pre-driver circuit 71 in accordance with the rotational position signal and in such a manner as to provide steering assist to the steering wheel 91 in accordance with vehicle speed. More specifically, the inverter circuits 60, 68 are controlled by turning on or off the FETs 61 to 66 through the pre-driver circuit 71. As the gates of the six FETs 61 to 66 are connected to the six output terminals of the pre-driver circuit 71, the pre-driver circuit 71 can change the potentials of the gates.

Further, the microcomputer 74 controls the inverter circuits 60, 68 in accordance with the voltages across the shunt resistor 53, which are input from the detected voltage amplifier circuit 77, so that the electrical current in generally a sine wave form is supplied to the motor 30.

Each of the electrical and mechanical parts of the electronic circuit-integrated motor device 1 is arranged as shown in FIGS. 5 to 9.

Figure 7:
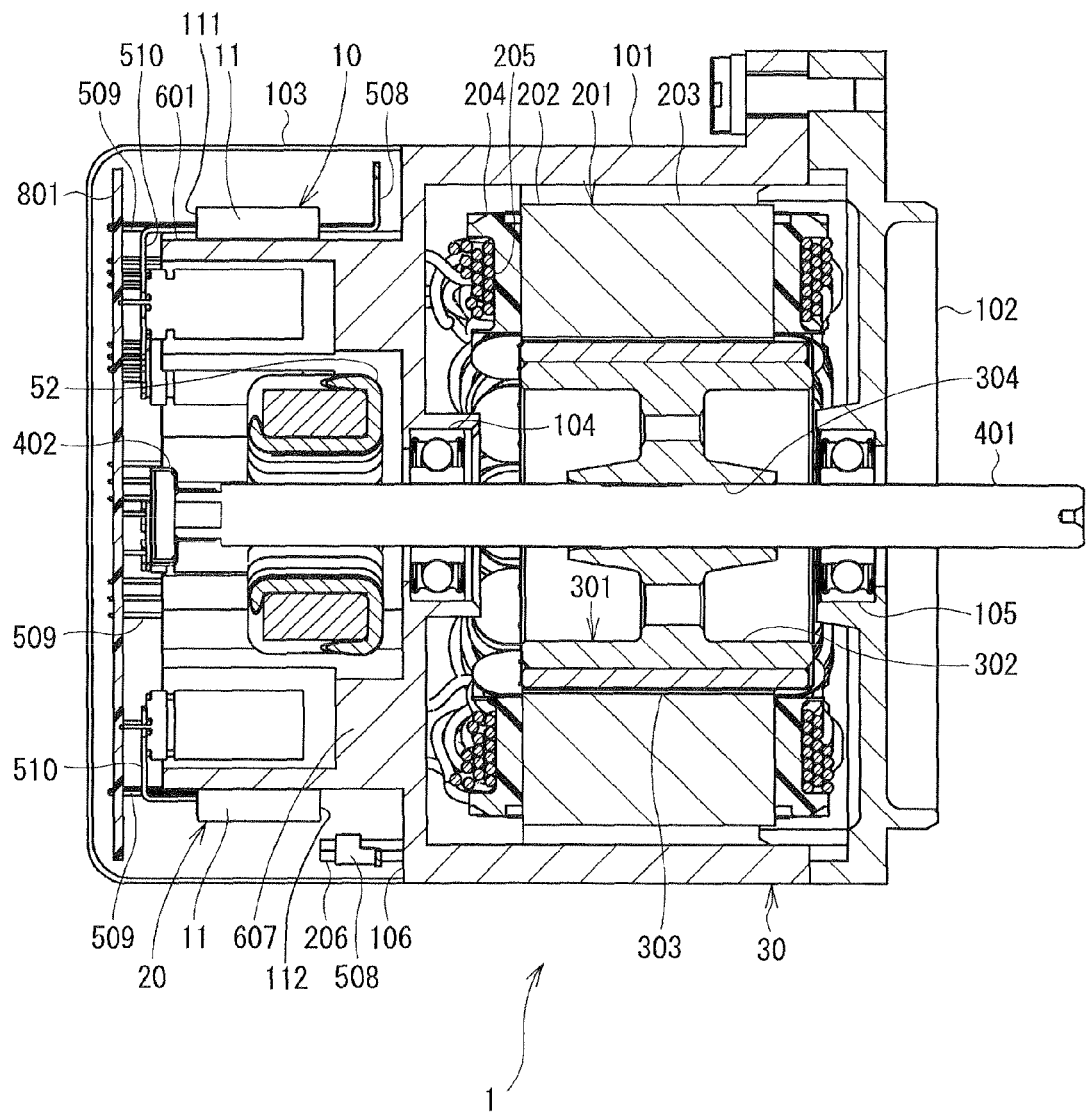
FIG. 7 is a sectional view showing the motor device viewed in section along the line VII-VII in FIG. 6.
Figure 8:
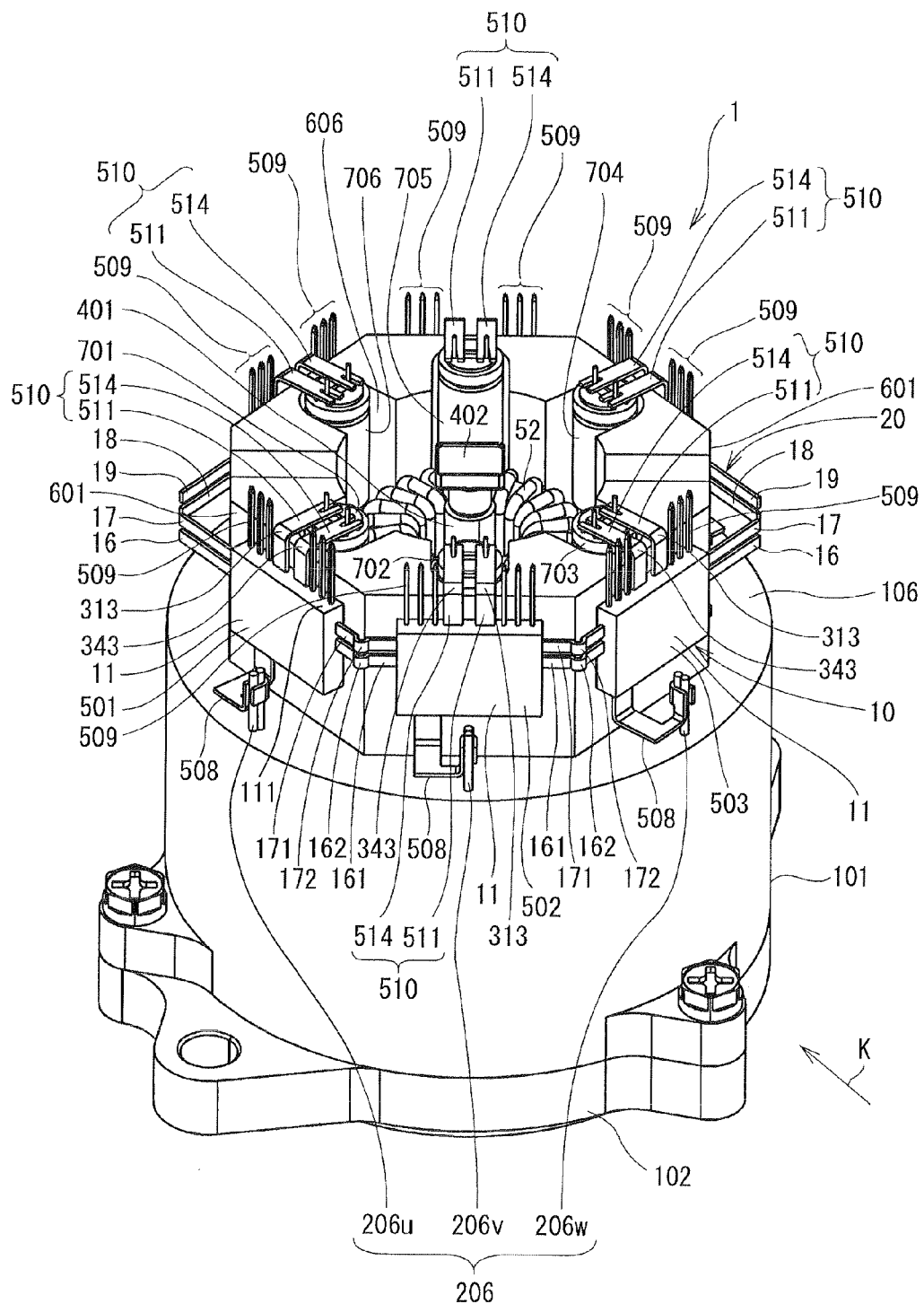
FIG. 8 is a perspective view showing the electronic circuit-integrated motor device using the semiconductor module according to the first embodiment.

As best shown in FIG. 7, the electronic circuit-integrated motor device 1 has a motor housing that includes a tubular motor case 101, which is in a bottomed cylindrical shape having a cylindrical part and an end wall 106 at one axial end of the cylindrical part; an end frame 102, which is screw-fastened to the other axial end of the cylindrical part of the motor case 101; and a cover 103, which is in a bottomed cylindrical shape fitted over the end wall 106 to cover electronic circuit part therein. An electric connector (not shown) for connection to the power source 51 is attached to the cover 103. Electrical power is supplied to bus bars 16 to 19, which are connecting members as shown in FIG. 8, through this connector.

The motor 30 also has a stator 201 positioned on the radially inside part of the motor case 101, a rotor 301 positioned in the radially inside part of the stator 201, and a shaft 401 that is fit firmly in the rotor 301 to rotate together with the rotor 301.

The stator 201 includes twelve salient poles 202, which protrude in the radially inward direction of the motor case 101. The salient poles 202 are disposed at predetermined angular intervals in the circumferential direction of the motor case 101. The salient poles 202 each include a multilayer core 203, which is formed by a stack of thin magnetic plates, and an insulator 204, which fits with the axially outer end of the multilayer core 203. Coils (windings) 205 are wound on the insulator 204. Each of the coils 205 is a three-phase winding of a U-phase, a V-phase or a W-phase and has two sets of U-phase, V-phase or W-phase. Either the first inverter circuit 60 or the second inverter circuit 68 controls the supply of electrical power to the individual sets of U-phase, V-phase and W-phase. A lead wire 206 for supplying electrical power to the coil 205 is connected to six points of the coils 205 and routed toward the electronic circuit from six holes provide in the axial end of the motor case 101. As described later, the lead wire 206 is routed from the axial end wall 106 of the motor case 101 to the radially outside part of semiconductor modules 501 to 506, which is shown in FIG. 4. In a radially outer space of the semiconductor modules 501 to 506, the lead wire 206 and coil terminal 508 are electrically connected as exemplarily shown in FIG. 8 in such a manner that the lead wire 206 is clamped by the coil terminal 508. It is noted that the lead wire 206 is shown as two wires in figures, assuming that the coils 205 are connected in the Δ-shape.

The rotor 301 is made, for instance, of iron or other magnetic materials and formed into tubular shape. The rotor 301 includes a rotor core 302 and permanent magnets 303 that are fixed to the radially outside part of the rotor core 302. The permanent magnets 303 include a total of ten poles, more specifically, five N poles and five S poles, which are alternately disposed in the circumferential direction.

The shaft 401 is fixedly fastened to a shaft hole 304 formed at the axial and radial center of the rotor core 302. The shaft 401 is rotatably supported by a bearing 104 on the axial end wall 106 of the motor case 101 and by a bearing 105 on the end frame 102. This ensures that the shaft 401 can rotate together with the rotor 301 with respect to the stator 201. The shaft 401 extends toward the electronic circuit section. The end of the shaft 401 that is positioned toward the electronic circuit section is provided with a magnet 402 for detecting the rotational position. A printed circuit board 801, which is made of resin, is positioned near the end of the shaft 401 that is positioned toward the electronic circuit section. The printed circuit board 801 is positioned in a space between the cover 103 and a heat sink 601 that is formed integrally with the motor case 101. The control circuit 70 (not shown in FIG. 7, but shown in FIG. 4) is formed on the printed circuit board 801. More specifically, a conductive wiring pattern is formed on the printed circuit board 801 by etching or other method, and an IC or other circuit forming the control circuit 70 is mounted on the printed circuit board 801. The position sensor 73 (not shown in FIG. 7, but shown in FIG. 4) is also mounted at the center of the printed circuit board 801. The position sensor 73 detects the rotational position of the magnet 402, that is, the rotational position of the shaft 401. A virtual straight line obtained by extending the central axis of the shaft 401 is referred to as the rotation axis of the motor 30.

Figure 5:
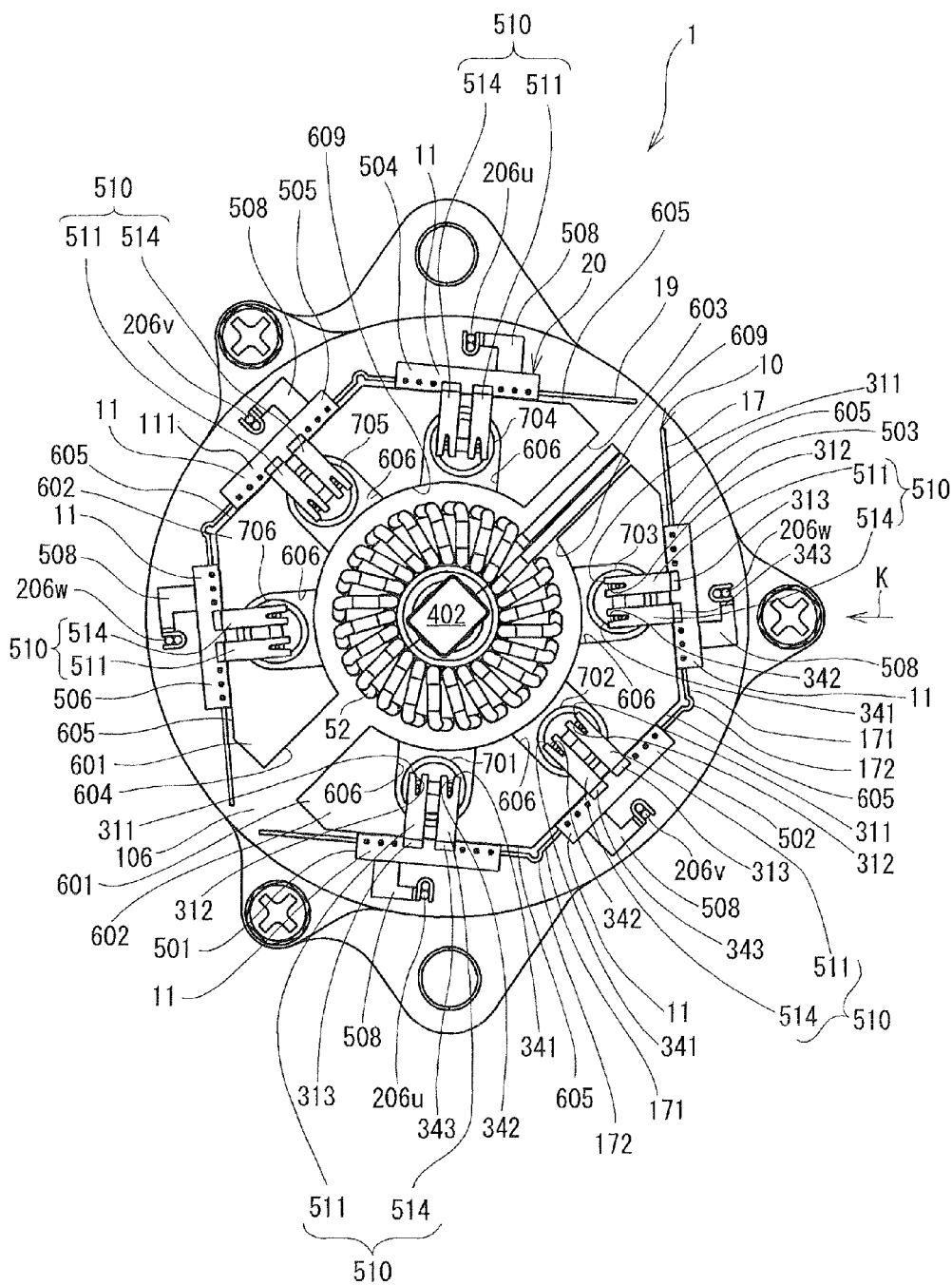
FIG. 5 is a plan view showing an electronic circuit-integrated motor device using the semiconductor module according to the first embodiment.

As shown in FIGS. 5 to 9, particularly in FIG. 7, the heat sink 601 is formed on the motor case 101. The heat sink 601 is formed on the axial end wall 106 of the motor case 101 in a raised or protruded manner. The heat sink 601 is formed integrally with the motor case 101 and extends in the axial direction of the shaft 401 toward the printed circuit board 801. The heat sink 601 includes two columnar members 602. Their cross sections, which are perpendicular to the axial direction of the shaft 401 are substantially trapezoidal in shape (FIG. 5). The two columnar members 602 are disposed in such a manner that the rotation axis of the motor 30 is sandwiched therebetween as exemplified in FIG. 5. Further, the columnar members 602 each have an arc portion 609 that is cut to form an arc around the rotation axis of the motor 30. The arc portion 609 forms a cylindrical space at the center of the heat sink 601. That is, the heat sink 601 is formed in a shape, which is like a thick-walled cylinder that is octagon-shaped when viewed in the axial direction. Obviously, the heat sink 601 need not always be octagon-shaped when viewed in the axial direction. Alternatively, it may be hexagon-shaped when viewed in the axial direction. The two columnar members 602 are formed so that they are not contiguous. A portion that makes the columnar members 602 noncontiguous includes the arc portion 609, which is cut to form an arc around the rotation axis of the motor 30, and planar cut surfaces 603, 604, which are formed on both sides of the arc portion 609.

The columnar members 602 of the heat sink 601 have outer side wall surfaces 605, which are wider than a side wall surface that faces in a radially outward direction and contiguous with the cut surfaces 603, 604. A total of six radially outer side wall surfaces 605 are formed circumferentially. Accommodation sections 606 are formed as recesses in a position that corresponds to the radially inside part of the columnar members 602 and to each side wall surface 605. The accommodation sections 606 are open to a cylindrical space around the rotation axis of the motor 30, which is formed by the arc portion 609. The accommodation sections 606 have an arc surface that defines the radially outside part of the accommodation sections 606 and fits to the outside diameters of capacitors 701 to 706. Further, the accommodation sections 606 are in a position that corresponds to the position of the side wall surfaces 605, and formed opposite the semiconductor modules 501 to 506 with the columnar members 602 positioned between the accommodation sections 606 and the semiconductor modules 501 to 506. Although a portion of the heat sink 601, on which the accommodation sections 606 are formed, is thinned, a thick portion 607, which is as thick as a portion where the accommodation sections 606 are not positioned, is formed between the accommodation sections 606 and the end wall 106 of the motor case 101 as shown in FIG. 7.

Figure 6:
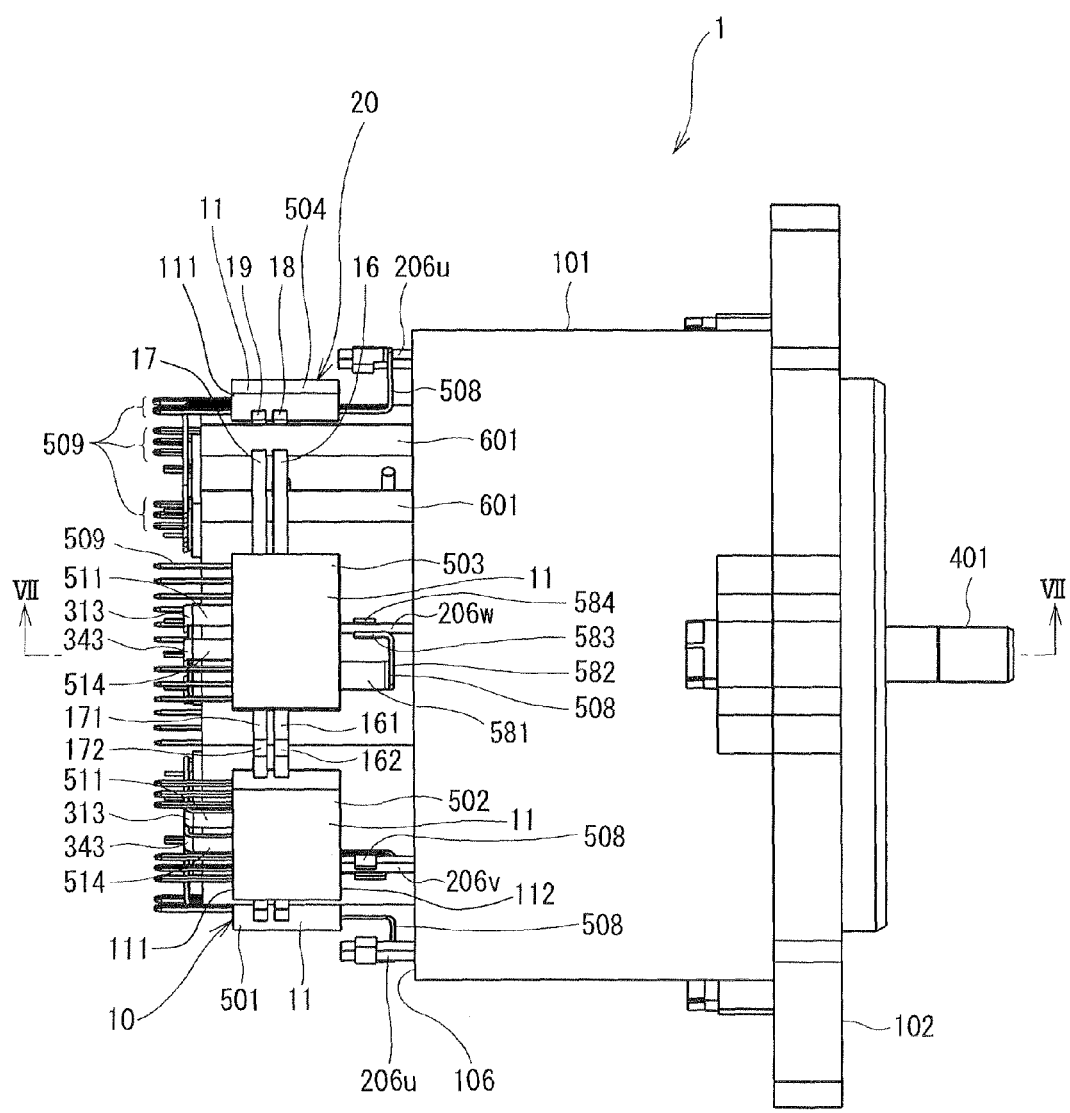
FIG. 6 is a side view showing the electronic circuit-integrated motor device using the semiconductor module according to the first embodiment.

As shown in FIG. 8, the semiconductor modules 501 to 506 are disposed on the side wall surfaces 605, which face the radially outside part of the heat sink 601. If necessary, the semiconductor modules 501 to 506 will be individually referred to as a U1 semiconductor module 501, a V1 semiconductor module 502, a W1 semiconductor module 503, a U2 semiconductor module 504, a V2 semiconductor module 505, and a W2 semiconductor module 506. The semiconductor modules 501 to 503 of the first inverter circuit 60 are linked by the first bus bar 16 and the second bus bar 17 to form a first linked semiconductor module unit 10. The semiconductor modules 504 to 506 of the second inverter circuit 68 are linked by the first bus bar 18 and the second bus bar 19 to form the second linked semiconductor module unit 20. The semiconductor modules 501 to 506 include the coil terminals 508, control terminals 509 and capacitor terminals 510. The coil terminals 508 are for connection to the phase coils of the motor 30 and mounted on a bottom side wall surface 112 toward the motor case 101 in a protruding manner and bent toward the radially outside part as shown in FIGS. 6 and 7. The control terminals 509, which are for connection to the control circuit 70, and the capacitor terminals 510, which are for connection to the capacitors 54 to 56, are mounted on a top side wall surface 111 opposite the motor case 101 in a protruding manner toward the cover 103 as shown in FIGS. 5 to 8. The linked semiconductor module units 10, 20 are formed by the semiconductor modules 501 to 506 as follows.

Figure 2:
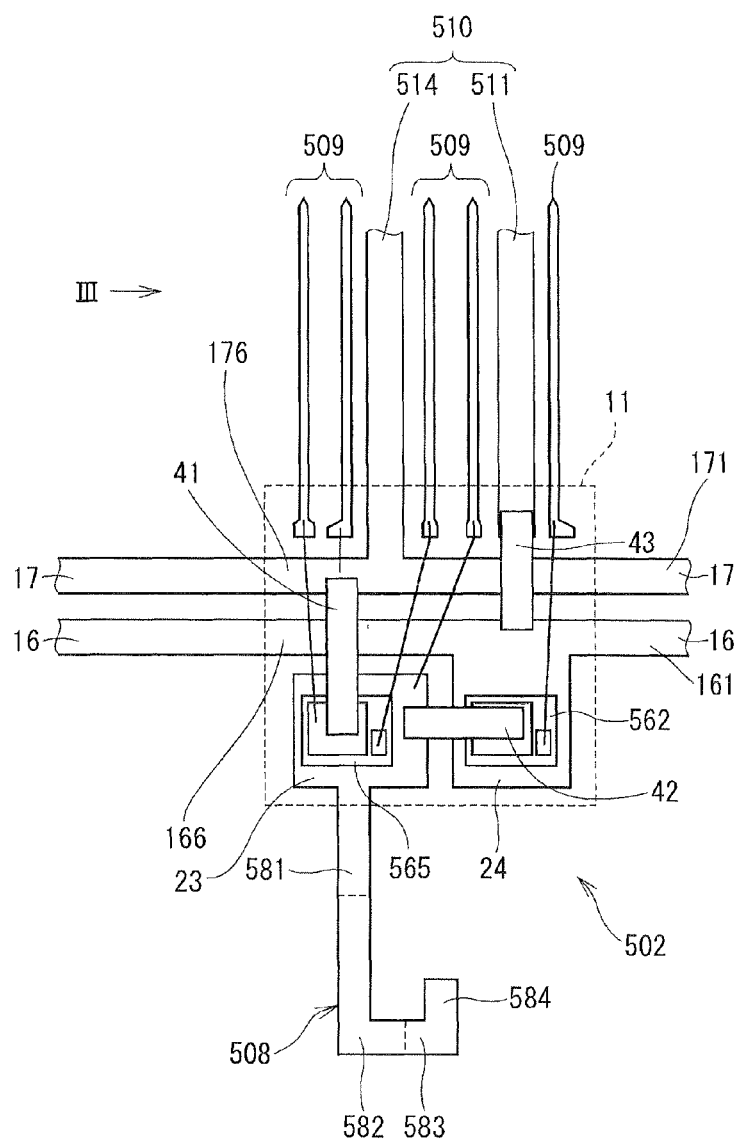
FIG. 2 is a plan view showing an inside of the semiconductor module according to the first embodiment.

The semiconductor modules 501 to 506 are mounted on the heat sink 601, which is mounted on the axial end of the motor case 101 in an axially raised or protruded manner. The semiconductor modules 501 to 506 are disposed, one by one, on the side wall surfaces 605, which face the radially outside wall surfaces of the heat sink 601. The bus bars 16, 17 for the linked semiconductor module unit 10 are bent so that the linked semiconductor module unit 10 formed by the semiconductor modules 501 to 503 is positioned around the rotation axis of the motor 30 to surround the shaft 401 and the heat sink 601 in the circumferential direction as shown in FIGS. 5 and 8. Similarly, the bus bars 18, 19 for the linked semiconductor module unit 20 are bent so that the linked semiconductor module unit 20 formed by the semiconductor modules 504 to 506 is positioned around the rotation axis of the motor 30 to surround the shaft 401 and the heat sink 601. The semiconductor modules 501 to 506 are shaped like a thin wall plate in the form of a cuboid or a rectangular solid that is extended in the planar direction of a molded semiconductor chip. One of the six surfaces having a relatively large area, for example the largest area, serves as a heat dissipation surface. A heat dissipation portion 569, which is shown in FIG. 2 and described below in more detail, is exposed from the heat dissipation surface. The semiconductor modules 501 to 506 are disposed in such a manner that the heat dissipation surface is in planar contact with the side wall surfaces 605. In this instance, the side wall surfaces 605 are plane surfaces. Accordingly, the heat dissipation surfaces of the semiconductor modules 501 to 506 are also plane surfaces. A heat dissipation insulation sheet (not shown) is placed between the semiconductor modules 501 to 506 and the heat sink 601 to provide electric insulation between the heat dissipation portion 569 and the heat sink 601. Even when the heat dissipation insulation sheet or other similar sheet-shaped member is placed between the semiconductor modules 501 to 506 and the heat sink 601 to provide an indirect contact, it is assumed that the semiconductor modules 501 to 506 are in planar contact with the heat sink 601.

As the semiconductor modules 501 to 506 are disposed on the side wall surfaces 605 of the heat sink 601, the line perpendicular to a semiconductor chip surface is perpendicular to the central axis of the shaft 401. That is, the semiconductor modules 501 to 506 are perpendicularly disposed.

The accommodation sections 606 of the heat sink 601 house the capacitors 701, 702, 703, 704, 705, 706, respectively, as shown in FIG. 5. When necessary, the capacitors 701 to 706 will be individually referred to as a U1 capacitor 701, a V1 capacitor 702, a W1 capacitor 703, a U2 capacitor 704, a V2 capacitor 705, and a W2 capacitor 706. The capacitors 701 to 703 are provided for the first inverter circuit 60, whereas the capacitors 704 to 706 are provided for the second inverter circuit 68. The U1 capacitor 701 corresponds to the capacitor 56. The V1 capacitor 702 corresponds to the capacitor 57 shown in FIG. 4. The W1 capacitor 703 corresponds to the capacitor 58. As for the second inverter circuit 68, the U2 capacitor 704 is a U-phase capacitor, the V2 capacitor 705 is a V-phase capacitor, and the W2 capacitor 706 is a W-phase capacitor.

The capacitors 701 to 706 are housed in the accommodation sections 606 of the heat sink 601 and respectively positioned near the semiconductor modules 501 to 506, which are disposed in a radially inward direction, while the heat sink 601 is clamped between the capacitors 701 to 706 and the semiconductor modules 501 to 506. The capacitors 701 to 706 are cylindrical in shape and disposed in such a manner that their axes are parallel to the central axis of the shaft 401. Further, the capacitors 701 to 706, which are positioned outside a resin part 11, are directly connected to the capacitor terminals 510 of the semiconductor modules 501 to 506. More specifically, the U1 semiconductor module 501 is connected to the U1 capacitor 701, the V1 semiconductor module 502 is connected to the V1 capacitor 702, and the W1 semiconductor module 503 is connected to the W1 capacitor 703. In addition, the U2 semiconductor module 504 is connected to the U2 capacitor 704, the V2 semiconductor module 505 is connected to the V2 capacitor 705, and the W2 semiconductor module 506 is connected to the W2 capacitor 706.

The shaft 401 is protruded from the end wall 106 toward the electronic circuit section including the printed circuit board 801 as shown in FIG. 7. As shown, for instance, in FIG. 5, the choke coil 52 is disposed in such a manner that the shaft 401 is inserted through the choke coil 52. Thus, the choke coil 52 surrounds the shaft 401 circumferentially. The choke coil 52 is placed in a cylindrical space that is formed by the arc portion 609 formed at the radial center of the heat sink 601. The choke coil 52 is formed by winding a coil wire around a doughnut-shaped iron core. The coil ends of the choke coil 52 are passed between the cut surfaces 603 of the columnar members 602 and routed out in a radially outward direction.

The coil ends of the choke coil 52 are connected to the power supply cable in series as understood in FIG. 4.

The connections between the coil terminal 508 and the lead wire 206, the semiconductor modules 501 to 506, the heat sink 601, the capacitors 701 to 706, and the choke coil 52 are sequentially arranged in the order named within the outside diameter range of the motor case 101, in the radially inward direction from the radially outside to the radially inside, to make effective use of the radial space.

Meanwhile, the power circuit 50 and the control circuit 70 are obviously required to exercise drive control over the motor 30. The power circuit 50 and the control circuit 70 are configured to form an electronic control unit (ECU). The electronic circuit-integrated motor device 1 is characterized by the internal configuration of the ECU.

The motor 30 used for the EPS system generates an output of approximately 500 W to 2 kW. The physical space occupied by the power circuit 50 and the control circuit 70 is approximately 20 to 40% of the entire electronic circuit-integrated motor device 1. Further, as the motor 30 needs to generate a large output, the power circuit 50 tends to be large in size. Therefore, the power circuit 50 occupies more than 70% of the region occupied by the power circuit 50 and the control circuit 70.

Large parts forming the power circuit 50 are the choke coil 52, the capacitors 54 to 56, and the FETs 61 to 67.

First of all, the semiconductor modules 501 to 506 having the FETs 61 to 67 will be described. As shown in FIG. 4, the semiconductor modules 501 to 503 form the first inverter circuit 60, whereas the semiconductor modules 504 to 506 form the second inverter circuit 68. More specifically, the U1, V1, and W1 semiconductor modules 501 to 503 form the first inverter circuit 60, whereas the U2, V2, and W2 semiconductor modules 504 to 506 form the second inverter circuit 68. The U1 semiconductor module 501 includes the FETs 61, 64, which are for the U-phase. The V1 semiconductor module 502 includes the FETs 62, 65, which are for the V-phase. The W1 semiconductor module 503 includes the FETs 63, 66, which are for the W-phase, and the FET 67, which is for protection against reverse connection.

The linked semiconductor module unit 10 is formed as the first bus bar 16 and the second bus bar 17 link the semiconductor modules 501 to 503. In addition, the linked semiconductor module unit 20 is formed as the first bus bar 18 and the second bus bar 19 link the semiconductor modules 504 to 506.

As shown in FIGS. 5 to 9, the linked semiconductor module unit 10 is formed as the U1 semiconductor module 501, the V1 semiconductor module 502, and the W1 semiconductor module 503 are coupled by the first bus bar 16, which is a first conductive member, and the second bus bar 17, which is a second conductive member. Further, the linked semiconductor module unit 20 is formed as the U2 semiconductor module 504, the V2 semiconductor module 505, and the W2 semiconductor module 506 are coupled by the first bus bar 18, which is a first conductive member, and the second bus bar 19, which is a second conductive member. The first bus bars 16, 18 are connected to the power supply cable (positive polarity side of the power source 51), whereas the second bus bars 17, 19 are connected to the ground (negative polarity side of the power source 51). Therefore, electrical power is supplied to the semiconductor modules 501 to 506 through the bus bars 16 to 19. The bus bars 16 to 19 thus couple the semiconductor modules 501 to 506 not only mechanically, but electrically as well. The linked semiconductor module unit 10 forms the first inverter circuit 60, whereas the linked semiconductor module unit 20 forms the second inverter circuit 68 shown in FIG. 4. The electronic circuit-integrated motor device 1 includes the two inverter circuits 60, 68. This ensures that the currents flowing to the inverter circuits 60, 68 are each reduced to one half. It should also be noted that the bus bars 16 to 19 form linking members.

The linked semiconductor modules 10 and 20 generally have the same configuration. Therefore, the more detailed description is made with respect to the semiconductor module unit 10 with reference to FIGS. 1 to 3.

The first bus bar 16 and the second bus bar 17 have an embedded part 166 (FIG. 2) and an exposed part 161. The embedded part 166 is embedded in the resin part 11 of each of the U1 semiconductor module 501, the V1 semiconductor module 502 and the W1 semiconductor module 503. The exposed part 161 is not embedded in the resin part 11. The embedded part 166 and the exposed part 161 are formed integrally to be contiguous as a single conductive member. The exposed part 161 has the bent part 162, which is bulged in an arc form from the linear part. The second bus bar 17 similarly has an embedded part 176, which is embedded in the resin part 11, and an exposed part 171, which is not embedded in the resin part 11 but is exposed from the resin part 11. The embedded part 176 and the exposed part 171 are formed integrally to be contiguous as a single member. The exposed part 171 has the bent part 172, which is bulged in an arc form from the linear part.

The first bus bar 16 and the second bus bar 17 are thus bendable by way of the bent parts 162 and 172. As shown in FIGS. 5 to 8, the semiconductor modules 501 to 503 are arranged radially outside of the heat sink 601 to be in surface-contact with the side wall surface 605. The semiconductor modules 501 to 503 are oriented such that the coil terminals 508 are located on the motor 30 side. Thus, heat radiation is promoted. Since the bent parts 162 and 172 are formed in the arcuate shape on the exposed parts 161 and 171, stress concentration, which will be caused when bent, can be reduced and damage to the resin part 11 can be reduced.

The semiconductor modules 501 to 506 are connectable to the coils 502 and capacitors without an intermediate member such as a printed circuit board. The terminal structure of the semiconductor modules 501 to 506 is further described in detail. Only the V1 semiconductor module 502 is shown in FIGS. 1 and 2 as an example of a plurality of semiconductor modules.

Figure 1:
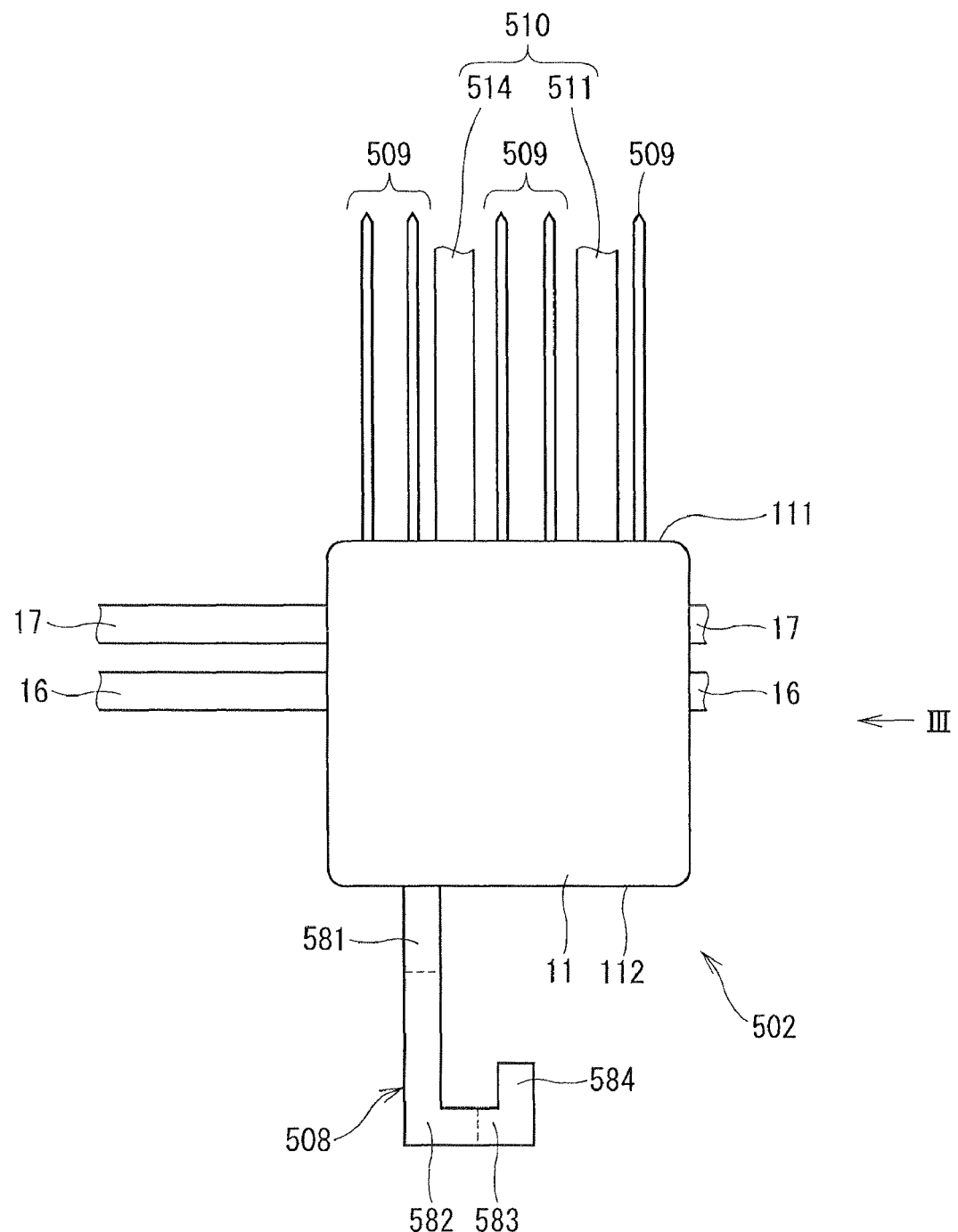
FIG. 1 is a plan view showing a semiconductor module according to the first embodiment of the present invention.

As shown in FIG. 1, the V1 semiconductor module 502 has capacitor terminals 510 and control terminals 509, which protrude generally perpendicularly from the top side wall surface 111 of the resin part 11. This top side wall surface 111 is on the side opposite to the motor case 101, as understood from FIG. 6 for example. The capacitor terminals 510 have the first terminal 511 and the second terminal 514. The V1 semiconductor module 502 also has the coil terminals 508, which protrude generally perpendicularly from the bottom side wall surface 112 of the resin part 11. This bottom side wall surface 112 is on the motor case 101 side, as understood from FIGS. 1 and 3. The coil terminal 508 is protruded at a position (near left end of the resin unit 11 in FIG. 1), which is displaced from the center in the bottom side wall surface 112 in the longitudinal direction of the linked semiconductor module unit 10. The coil terminal 508 is shaped to bend perpendicularly at a plurality of points, so that it extends from the bottom side wall surface 112 in the downward direction, right direction and the upward direction for example in FIG. 1. The waste of the lead frame, which is caused in manufacture, can be reduced by thus shaping the coil terminal 508 to have a plurality bends. The bottom side wall surface 112 provides a protrusion surface, from which the coil terminal 508 protrudes.

The bus bars 16, 17, the coil terminal 508, the control terminals 509 and the capacitor terminals 510 are arranged in the following positional relation. The coil terminal 508 is provided on one side wall surface (bottom side wall surface 112), while the control terminals 509 and the capacitor terminals 510 are provided on the different side wall surface (top side wall surface 111). Thus, the coil terminal 508 and the control terminals 509 protrude from the resin part 11 in the opposite directions. That is, both the control terminals 509 and the capacitor terminals 510 protrude from the top side wall surface 111, which is opposite to the bottom side wall surface 112. The coil terminal 508 protrudes in a direction perpendicular to the bus bars 16 and 17. The control terminals 509 and the capacitor terminals 510 also protrude in a direction perpendicular to the bus bars 16 and 17.

Figure 9:
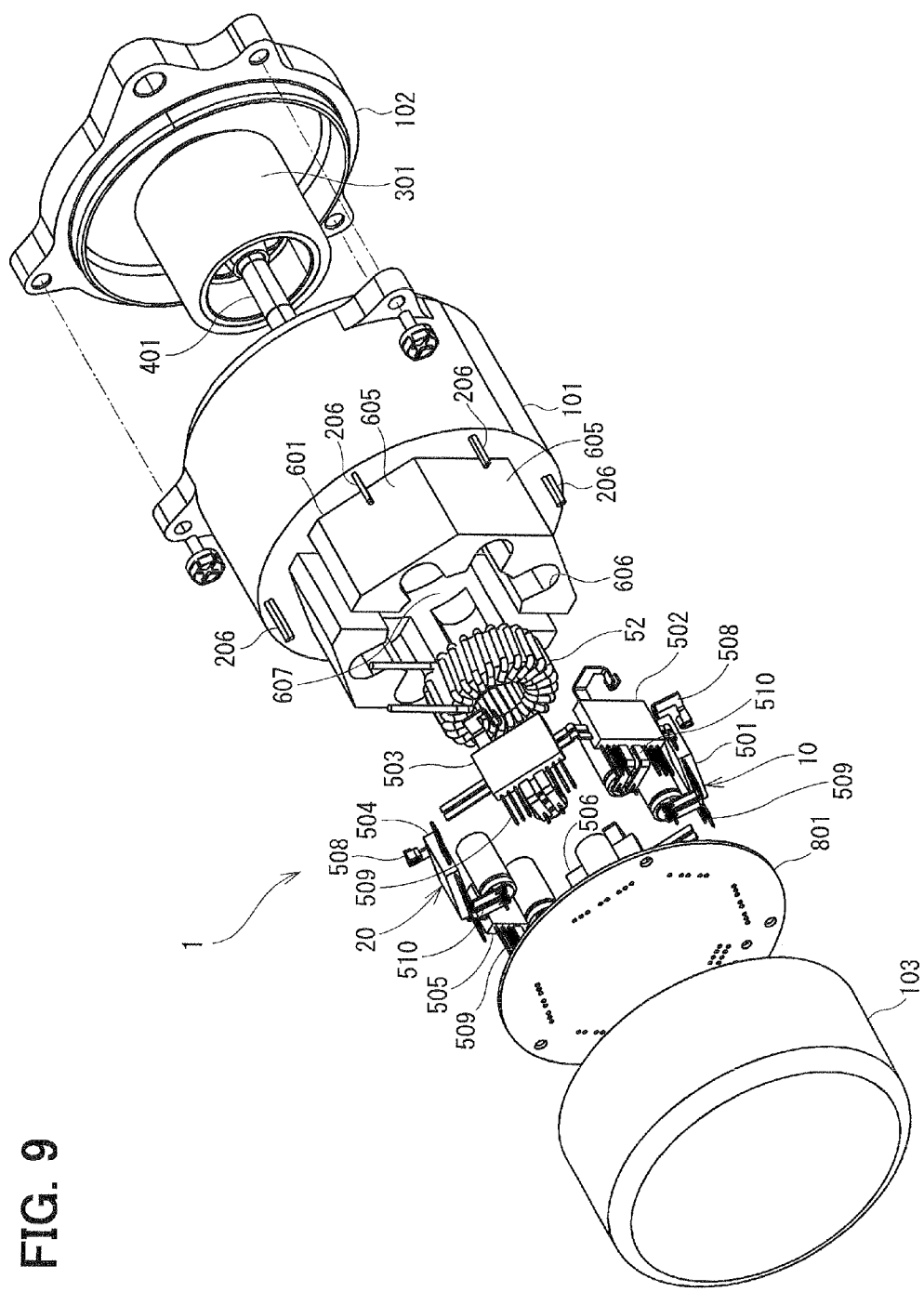
FIG. 9 is a perspective exploded view showing the electronic circuit-integrated motor device using the semiconductor module according to the first embodiment.
Figure 10:
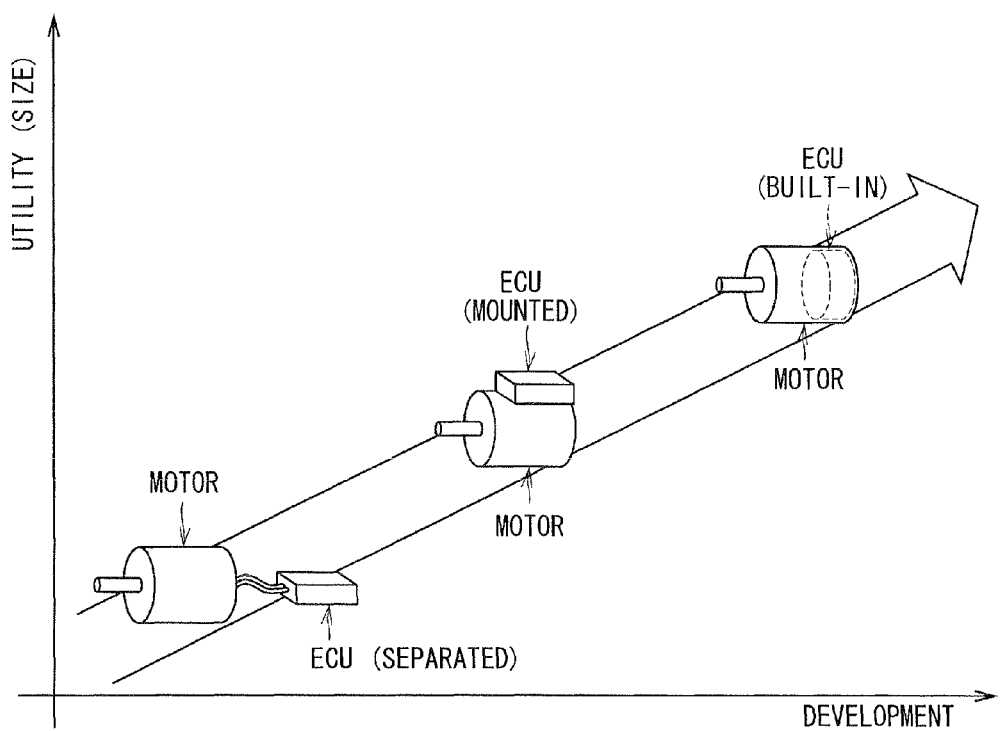
FIG. 10 is a graph showing development in integration of the electronic circuit with a motor.

This terminal structure is the same among the semiconductor modules 501 to 506. As shown in FIGS. 5 to 8, the linked semiconductor module unit 10 and 20 are arranged such that the coil terminal 508 is on the end wall 106 (motor case 101) side, and the top side wall surface 111, on which the capacitor terminals 510 and the control terminals 510 are formed, are on the printed circuit board 801 side. Thus, the motor case 101, the semiconductor modules 501 to 506 and the printed circuit board 801 are arranged in this order. Specifically, the semiconductor modules 501 to 506 are located between the motor case 101 and the printed circuit board 801 in the axial direction of the electronic circuit-integrated motor device 1 as shown in FIGS. 7 and 9.

The capacitor terminals 510, the coil terminal 508 and the control terminals 509 are connected as shown in FIGS. 5 to 8. The first terminal 511 is bent in the radially inward direction along the heat sink 601 at a bent part 313. On a top end 311 of the first terminal 511, a cut part 312 is formed by cutting out the top end part 311 in the U-shape. In this cut part 312, the first terminal 511 is directly connected to the positive terminal of the capacitor 701 to 706. The second terminal 514 is bent along the heat sink 601 at a bent part 343 in the same manner as the first terminal 511. On a top end part 341 of the second terminal 514, a cut part 342 is formed by cutting out the top end part 341 in the U-shape. In this cut part 342, the second terminal 514 is directly connected to the negative terminal of the capacitor 701 to 706. Thus, the semiconductor modules 501 to 506 and the capacitors 701 to 706 are connected directly without any separate member such as a printed circuit board.

When the semiconductor module 501 to 506 is arranged perpendicularly in the electronic circuit-integrated motor device 1, the coil terminal 508 is bent at a position indicated by a dotted line in FIG. 1 to clamp the lead wire 206 of the coil 205. The coil terminal 508 includes a droop part 581, an intermediate part 582, a rise part 583 and a clamp part 584, which are formed integrally as a single member. The droop part 581 protrudes generally perpendicularly from the bottom side wall surface 112, which is on the motor case 101 side. The bottom side wall surface 112 is perpendicular to the surface of the semiconductor chips 562 and 565 (FIG. 2). The droop part 581 is displaced from the width-wise center of the bottom side wall surface 112 in the width direction (left direction in FIG. 1). The intermediate part 582 is bent from the droop part 581 in the direction of thickness of the resin part 11. The intermediate part 582 is formed in the L-shape to extend from the radially outside direction to the circumferential direction. The rise part 583 is formed to rise in the direction of leaving from the axial end wall 106 of the motor case 101. The rise part 583 and the droop part 581 are formed at different positions displaced in the width direction of the resin part 11. The clamp part 584 is formed at the top end of the rise part 583 and bent in the U-shape to open in the radially outward direction. The clamp part 584 clamps the lead wire 206 of the coil 205, which is taken out from a hole formed in the axial end wall 106 of the motor case 101, thereby providing electrical connection. The coil terminal 508 and the lead wire 206 of the coil 205 are connected directly in direct contact.

Specifically, the coil terminal 508 of the U1 semiconductor module 501 is connected to lead wire 206u of the U-phase of the first inverter 60. The U1 semiconductor module 501 is thus connected to the U-phase of the coil 205 to turn on and off the coil current of the U-phase. The coil terminal 508 of the V1 semiconductor module 502 is connected to lead wire 206v of the V-phase of the first inverter 60. The V1 semiconductor module 502 is thus connected to the V-phase of the coil 205 to turn on and off the coil current of the V-phase. The coil terminal 508 of the W1 semiconductor module 503 is connected to lead wire 206w of the W-phase of the first inverter 60. The W1 semiconductor module 503 is thus connected to the W-phase of the coil 205 to turn on and off the coil current of the W-phase. Similarly, the coil terminal 508 of the U2 semiconductor module 504 is connected to lead wire 206u of the U-phase of the second inverter 68. The U2 semiconductor module 504 is thus connected to the U-phase of the coil 205 to turn on and off the coil current of the U-phase. The coil terminal 508 of the V2 semiconductor module 505 is connected to lead wire 206v of the V-phase of the second inverter 68. The V2 semiconductor module 505 is thus connected to the V-phase of the coil 205 to turn on and off the coil current of the V-phase. The coil terminal 508 of the W2 semiconductor module 506 is connected to lead wire 206w of the W-phase of the second inverter 68. The W2 semiconductor module 506 is thus connected to the W-phase of the coil 205 to turn on and off the coil current of the W-phase. The lead wire 206u, 206v and 206w thus form the lead wire 206.

The top end parts of the control terminals 509 are inserted into through holes of the printed circuit board 801 (FIGS. 7 and 9), which forms the control circuit 70 and soldered. Thus the semiconductor modules 501 to 503 are electrically connected to the control circuit 70 formed on the printed circuit board 801.

The internal configuration of the V1 semiconductor module 502 is shown in FIG. 2. The V1 semiconductor module 502 has lands 23 and 24, which are embedded in the resin part 11. The resin part 11 is formed in generally the rectangular parallel-piped. The land 23 is formed integrally with the coil terminal 508 and mounts thereon a semiconductor chip 565. The semiconductor chip 565 has the FET (Su−) 65 and is connected to the second bus bar 17 by wire-bonding by using a wire 41. The land 24 is formed integrally with the first bus bar 16 and mounts thereon a semiconductor chip 562. The semiconductor chip 562 has the FET (Su+) 62 and is connected to the land 23 by wire-bonding by using a wire 42. The semiconductor chips 562 and 565 are sealed and encapsulated in the resin part 11.

The base parts of the control terminals 509 are connected to the first bus bar 16, the second bus bar 17, the lands 23, 24, the semiconductor chips 562, 565 and the like by wire bonding. The base part of the first terminal 511 forming the capacitor terminals 510 is electrically connected to the first bus bar 16 by wire-bonding by using a wire 43. The base part of the second terminal 514 is formed integrally with the second bus bar 17.

Figure 3:
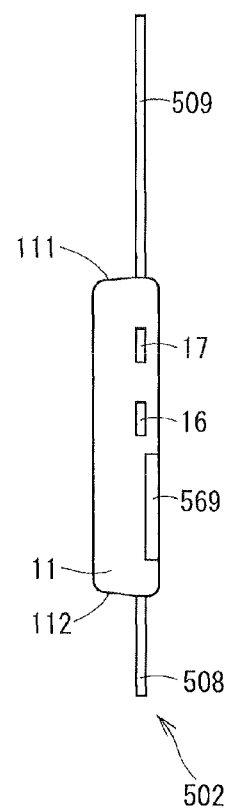
FIG. 3 is a side view showing the semiconductor module viewed in the direction III in FIG. 2.

As shown in FIG. 3, the V1 semiconductor module 502 has a heat dissipation part 569, which is press-formed. The heat dissipation part 569 protrudes in a direction opposite to the surface mounting the semiconductor chips 562 and 565. The heat dissipation part 569 contacts the heat sink 601 through a heat radiating insulation sheet (not shown) to promote heat radiation. The heat dissipation part 569 is formed in the similar manner in all the semiconductor modules 501 to 506.

The linked semiconductor module unit 10 is manufactured in the following process. The lands formed in each semiconductor module 501 to 503, which includes the first bus bar 16, the second bus bar 17, the coil terminal 508, the control terminals 509, the capacitor terminals 510 and the lands, are formed of a sheet of lead frame. The lead frame is about 0.64 mm thick and thinner than the copper film of the normal printed circuit substrate. When the linked semiconductor module unit 10 is arranged perpendicularly on the side walls of the heat sink 601 as shown in FIGS. 5 to 8, the thicknesses of the bus bars 16, 17, which are the widths of the bus bars 16, 17 in the radial direction of the shaft 401, are thinner than the widths of the bus bars 16, 17 in the axial direction of the shaft 401.

The semiconductor chips are first mounted on the corresponding lands, then electrically connected by the wire-bonding or the like and finally molded within the resin part 11 to form each semiconductor module 501 to 503. The unnecessary parts of the lead frame are cut out so that the linked semiconductor module unit 10 is provided. After thus forming the semiconductor module unit 10 in a flat or planar shape, the first bus bar 16 and the second bus bar 17 are bent. The semiconductor module unit 10 is then arranged along the heat sink 601 in the peripheral direction. The linked semiconductor module unit 20 is also formed and arranged in the same manner.

As described above, each of the semiconductor modules 501 to 506 have the capacitor terminals 510 for direct connection to the corresponding capacitors 701 to 706 as well as the coil terminal 508 for direct connection to the lead wire 206 of the coil 205. As a result, the semiconductor modules 501 to 506 can be connected to the capacitors 701 to 706 or to the lead wire 206 of the coil 205 without using a printed circuit board. The number of parts required for connection between electronic parts can be reduced. Since the semiconductor modules 501 to 506 and the capacitors 701 to 706 are connectable to each other without a printed circuit board, the capacitor terminals 510 can be formed in a desired size without being limited by the thickness of the copper film of the printed circuit board. In addition, the semiconductor modules 501 to 506 and the capacitors 701 to 706 are arranged closely to face each other in the radial direction. As a result, the capacitor terminals 510 can be formed to be thick and short so that its impedances may be reduced.

Since the semiconductor modules 501 to 506 and the lead wires 206 of the coils 205 are connectable to each other without a printed circuit board, the coil terminals 508 can be formed in a desired size without being limited by the thickness of the copper film of the printed circuit board. In addition, the semiconductor modules 501 to 506 are arranged near the take-out position of the lead wire 206 of the coil 205. As a result, the coil terminals 508 can be formed to be thick and short so that its impedance may be reduced. This improves the reliability of operation of the electronic circuit-integrated motor device 1.

The control terminals 509 are provided to protrude from the resin part 11 in such a manner that it is connectable to the printed circuit board 801 having the control circuit 70 thereon for controlling the current supply to the coils 205. The coil terminal 508 and the control terminals 509 are provided on the different wall surfaces of the resin part 11. Specifically, the coil terminal 508 and the control terminals 509 are protruded in the opposite directions from the resin part 11 such that the resin part 11 is sandwiched between such terminals 508 and 509. The semiconductor modules 501 to 506 are arranged between the motor case 101 and the printed circuit board 801 in the axial direction of the shaft 401. The coil terminals 508 are positioned to face the motor case 101 and the control terminals 509 are positioned to face the printed circuit board 801. As a result, space can be used efficiently for sizing down the motor device 1.

The capacitor terminals 510 have the first terminal 511 and the second terminal 514. The first terminal 511 is connected to the positive terminal of the capacitor 701 to 706. The second terminal 514 is connected to the negative terminal of the capacitor 701 to 706. The first terminal 511 is connected to the first bus bar 16, which is connected to the power supply cable. The second terminal 514 is formed integrally with the second bus bar 17, which is connected to the ground. As a result, the semiconductor module 501 to 506 and the capacitor 701 to 706 can be connected in a simple configuration.

The capacitor terminals 510 has the cut parts 312 and 342, which are formed by cutting out the top end part 311 and 341 in the U-shape, and connects to the terminals of the capacitor at the cut parts 312 and 342. The semiconductor module 501 to 506 can be readily connected to the capacitor 701 to 706.

The lands 23 and 24 protrude in the direction, which is opposite to the mounting surface for the semiconductor chips 562 and 565, and have heat dissipation part 569, which is exposed from the resin part 11. The semiconductor modules 501 to 506 are so arranged that the respective heat dissipation parts 569 contact the heat sink 601 thereby promoting heat dissipation.

The coil terminal 508 is bent at a plurality of points to provide the droop part 581, the intermediate part 582, the rise part 583 and the clamp part 584. As understood from FIG. 8, the droop part 581 is protruded from the bottom side wall surface 112 of the resin part 11, which is on the motor case 101 side. The intermediate part 582 is formed by bending to extend from the droop part 581 in the radially outward direction. The rise part 583 is formed to rise in the direction opposite to the motor case 101. The clamp part 584 is formed in the U-shape at the top end of the rise part 583 to open in the radially outward direction. The clamp part 584 clamps the lead wire 206 of the coil 205. The coil terminal 508 is bent and clamps the lead wire 206 of the coil 205 to provide electrical connection. As a result, the number of parts can be reduced and the configuration is simplified.

The droop part 581 is provided at the position displaced from the center of the resin part 11 in the width direction of the resin part 11. The lead wire 206 is taken out generally from the width center of the resin part 11. Therefore, by forming the droop part 581 at the position displaced from the width center of the resin part 11 and bending the same, the clamp part 584 can be located at the appropriate position, at which the lead wire 206 is present.

The linked semiconductor module unit 10 is used in the electronic circuit-integrated motor device 1. The motor device 1 includes the cylindrical motor case 101 forming the outer frame, the stator 32 fixed to the inside wall surface of the motor case 101 with the coils 205 wound in three phases, the rotor 33 disposed radially inside the stator 32 and the shaft 401 rotatable with the rotor 33. The semiconductor module 501 to 506 is arranged within a circular perimeter of the motor case 101. The semiconductor module 501 to 503 is arranged in the longitudinal direction from the end wall 106 so that the perpendicular line to the surface of the semiconductor chip is not parallel to the central axis of the shaft 401. That is, the linked semiconductor module unit 10 is arranged perpendicularly within a motor silhouette or outline, which is formed by imaginarily extending the motor case 101 in the axial direction. That is, all the semiconductor modules 501 to 503 are arranged in a manner that the two parallel wide side wall surfaces are in parallel with the shaft 401. As a result, the size of the motor 30 in the radial direction can be reduced. The linked semiconductor module unit 20 is configured and arranged in generally the same manner as the linked semiconductor module unit 10 so that it provides the same advantages as the linked semiconductor module unit 10.

The electronic circuit-integrated motor device 1 using the linked semiconductor module units 10, 20 provides the following advantages.

(1) In the electronic circuit-integrated motor device 1, the semiconductor modules 501 to 506 are disposed in the direction of the central axis of the shaft 401 relative to the end wall 106 of the motor case 101. This makes it possible to reduce the physical size in the radial direction of the motor case 101. Further, the semiconductor modules 501 to 506 are perpendicularly arranged to bring them into planar contact with the side wall surfaces 605 of the heat sink 601. Furthermore, the heat sink 601 includes the accommodation sections 606 in which the six capacitors 701 to 706 are disposed on the radially outside parts to surround the shaft 401 and the choke coil 52. The heat sink 601 and capacitors 701 to 706 are disposed in the radially inward direction of the six semiconductor modules 501 to 506. Unlike a conventional configuration, the above-described configuration makes it possible to reduce the axial physical size as well. As a result, the physical size of the electronic circuit-integrated motor device 1 can be minimized.

Figure 13:
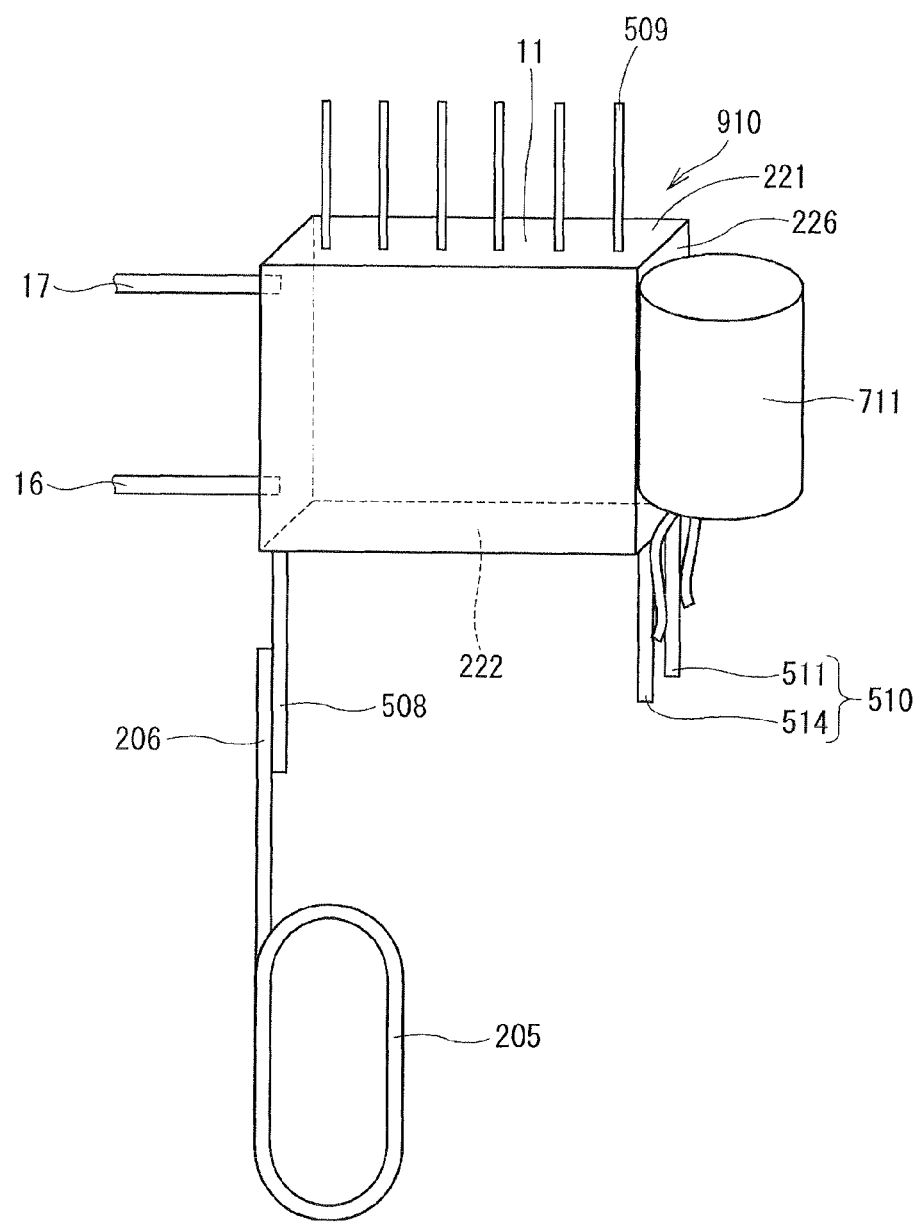
FIG. 13 is a schematic view showing a semiconductor module according to the third embodiment of the present invention.

The motor for the EPS system has evolved as shown in FIG. 13. Initially, a "separated" configuration was employed so that the motor was separate from the ECU. Then, a "mounted" configuration was frequently employed so that no wiring connections were needed. However, the "mounted" configuration was such that the ECU is housed in a case shaped like a rectangular parallelepiped and mounted outside a motor case. Next, a "built-in" configuration was employed so that the ECU was contained within a motor silhouette wherever possible. However, the use of the "built-in" configuration increased the axial physical size. As for the electronic circuit-integrated motor device 1, however, the semiconductor modules 501 to 506 are perpendicularly disposed. In addition, the space created by the use of such a configuration is utilized to improve the positional relationship to the capacitors 701 to 706. That is, the electronic circuit-integrated motor device 1 is implemented by improving the positional relationship between various parts. The electronic circuit-integrated motor device 1 employs an "integrated" configuration, which is superior to the "built-in" configuration.

(2) In the electronic circuit-integrated motor device 1, the lines perpendicular to the semiconductor chip surfaces of the semiconductor modules 501 to 506 are perpendicular to the central axis of the shaft 401. This will further increase the space around the shaft 401 in the radial direction.

(3) In the electronic circuit-integrated motor device 1, the capacitors 701 to 706 are disposed near the semiconductor modules 501 to 506 to face each other in the radial direction at generally the same axial position from the end wall 106. Further, the semiconductor modules 501 to 506 include the capacitor terminals 510, which are dedicated to the capacitors. The terminals of the capacitors 701 to 706 are directly connected to the capacitor terminals 510 and not routed through the printed circuit bard 801. When this connection scheme is employed, the wiring between the semiconductor modules 501 to 506 and the capacitors 701 to 706 can be significantly shorter than when the semiconductor modules 501 to 506 are connected to the capacitors 701 to 706 through the printed circuit board 801. This permits the capacitors 701 to 706 to fully exercise their functions. In addition, the capacitors 701 to 706 are disposed for the semiconductor modules 501 to 506 on a one-to-one basis. This makes it possible to relatively decrease the capacitances of the capacitors 701 to 706 and reduce the physical sizes of the capacitors 701 to 706.

(4) The electronic circuit-integrated motor device 1 includes the heat sink 601, which is mounted on the end wall 106 of the motor case 101 in a standing manner and oriented in the direction of the central axis of the shaft 401. The semiconductor modules 501 to 506 are disposed on the side wall surfaces 605 of the heat sink 601. The semiconductor modules 501 to 506 are disposed around the rotation axis of the motor 30 as the bus bars 16 to 19 are bent on the radially outside part of the heat sink 601 and along the outer periphery of the heat sink 601. This promotes the dissipation of heat from the semiconductor modules 501 to 506. Therefore, the present embodiment can also be applied to any other electric power assist apparatuses, in which a large current flows to a motor.

(5) In the electronic circuit-integrated motor device 1, the capacitors 701 to 706 for the semiconductor modules 501 to 506 are disposed on the same side as the heat sink 601, that is, positioned in the radially inside part of the heat sink 601 such that the capacitors 701 to 706 do not protrude in the radially inward direction from the radially inside wall surface of the heat sink 601, that is, arc portion 609. More specifically, the capacitors 701 to 706 are housed in the accommodation sections 606, which are formed on the heat sink 601. This makes it possible to provide a space on the radially outside part of the semiconductor modules 501 to 506. This space facilitates, for instance, the routing of electrical wires.

(6) In the electronic circuit-integrated motor device 1, the heat dissipation surfaces of the semiconductor modules 501 to 506 are in contact with the side wall surfaces 605 of the heat sink 601. This configuration further promotes the dissipation of heat from the semiconductor modules 501 to 506.

(7) Further, as the side wall surfaces 605 are plane surfaces, the heat dissipation surfaces of the semiconductor modules 501 to 506 are also plane surfaces. This structure is advantageous from the viewpoint of ease of planar processing for the semiconductor modules 501 to 506.

(8) In the electronic circuit-integrated motor device 1, the heat sink 601 is formed into an octagon-shaped thick-walled cylinder and positioned around the central axis of the shaft 401. In addition, the choke coil 52 is positioned on the radially inside central part of the heat sink 601. Therefore, the physical size of the electronic circuit-integrated motor device 1 can be minimized even when the physical size of the employed choke coil 52 is relatively large.

(9) Further, the heat sink 601 has two cut surfaces 603, 604 in parallel to face each other forming a noncontiguous portion. The coil wire of the choke coil 52 is passed between the cut surfaces 603 and routed out in a radially outward direction. This facilitates the routing of electrical wires for the choke coil 52.

(10) In the electronic circuit-integrated motor device 1, the semiconductor modules 501 to 506 and the printed circuit board 801 are disposed in the axial direction. The semiconductor modules 501 to 506 include the control terminals 509, which are soldered to the printed circuit board 801. This permits the control terminals 509 to establish electrical connections. Therefore, the configuration does not become complicated even when the control circuit 70 is positionally independent of the semiconductor modules 501 to 506.

(11) In the electronic circuit-integrated motor device 1, the semiconductor modules 501 to 506 have the coil terminals 508, which are positioned toward the end wall 106, which is opposite to the printed circuit board 801. The coil terminals 508 are electrically connected to the lead wire 206. This makes it relatively easy to make an electrical connection to the coil 205 for the stator 201.

(12) In the electronic circuit-integrated motor device 1, the magnet 402 is mounted on the leading end of the shaft 401. The position sensor 73 on the printed circuit board 801 detects the rotational position of the magnet 402 to determine the rotational position of the shaft 401. This makes it relatively easy to detect the rotation of the motor 30.

(13) In the electronic circuit-integrated motor device 1, the W1 semiconductor module 503 and the U2 semiconductor module 504 include the FET 67, which provides protection against reverse connection. This makes it possible to prevent the capacitors 701 to 706 from being damaged even when an erroneous power source connection is made.

(14) In the electronic circuit-integrated motor device 1, the semiconductor modules 501 to 506 variously relate to the three phases, that is, the U-phase, V-phase, and W-phases. More specifically, the U1 and U2 semiconductor modules 501, 504 relate to the U-phase; the V1 and V2 semiconductor modules 502, 505 relate the V-phase; and the W1 and W2 semiconductor modules 503, 506 relate to the W-phase. Further, the semiconductor modules 501 to 503 are coupled by the first bus bar 16 and the second bus bar 17 to form the linked semiconductor module unit 10, and the semiconductor modules 504 to 506 are coupled by the first bus bar 18 and the second bus bar 19 to form the linked semiconductor module unit 20. As the semiconductor modules 501 to 506 are functionally modularized, it is easy to configure the inverter circuits 60, 68.

<Terminal Structure of Semiconductor Module>

The coil terminal 508, the control terminals 509 and the capacitor terminals 510 may be provided at a variety of locations on the resin part 11 of each semiconductor, module 501 to 506. For example, the locations may be determined in accordance with the positions of the lead wire 206 of the coil 205, the capacitors 701 to 706 and the printed circuit board 801. The terminal structure therefore is described with reference to FIGS. 11 to 15, which schematically show the positional relation among the coil terminal 508, the control terminals 509 and the capacitor terminals 510. The generally same or similar parts are denoted by the same or similar reference numerals among a plurality of embodiments. The V1 semiconductor module 502 shown in FIG. 11 corresponds to the semiconductor module according to the first embodiment. Its terminal structure is supplemented below. Further, the terminal structure of semiconductor modules according to the second to the fifth embodiments are described with reference to FIGS. 12 to 15.

Figure 11:
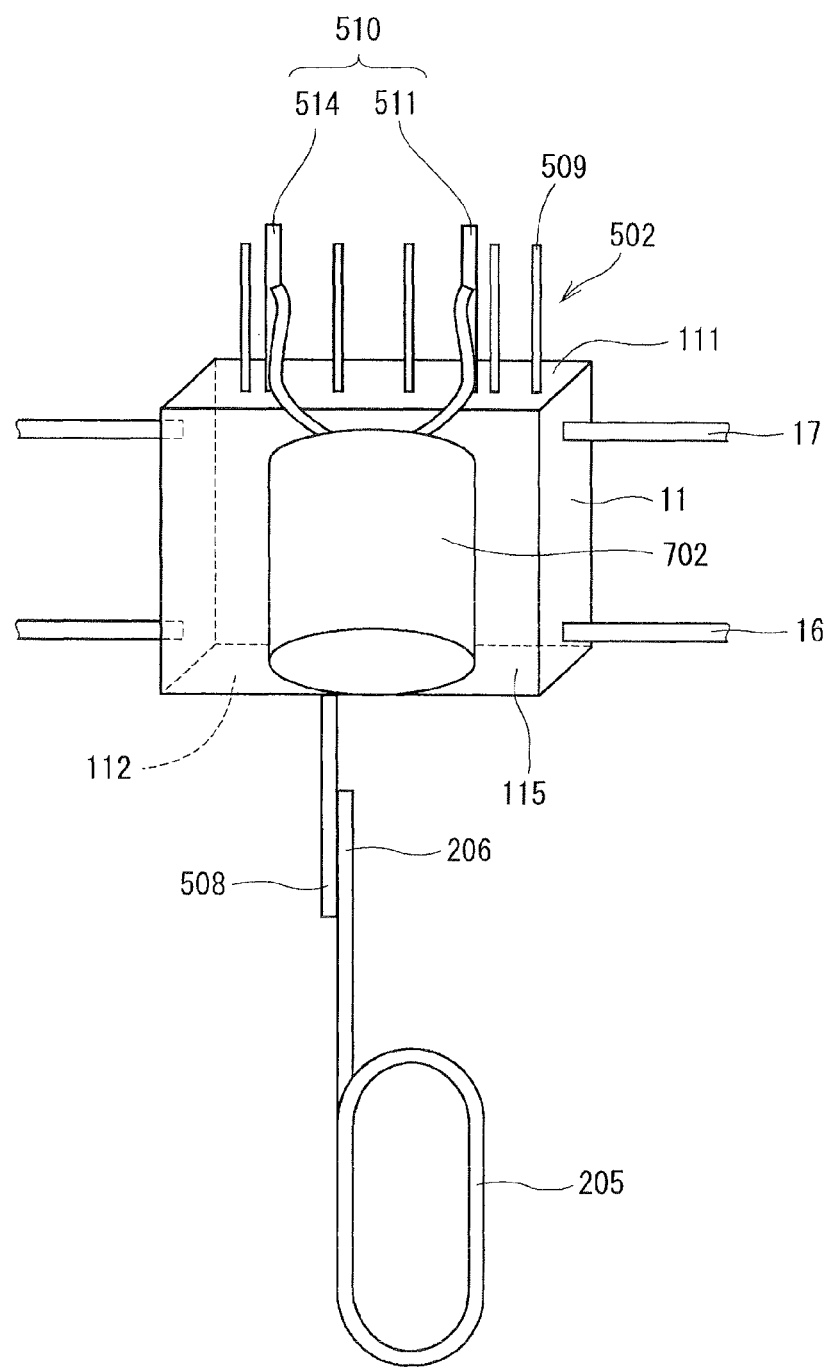
FIG. 11 is a schematic view showing the semiconductor module according to the first embodiment.

In the V1 semiconductor module 502, as shown in FIG. 11, the coil terminal 508 protrudes generally perpendicularly from the bottom side wall surface 112 of the resin part 11. The bottom side wall surface 112 is on the motor case 101 side (FIG. 8). The control terminals 509 and the capacitor terminals 501 protrude generally perpendicularly to the top side wall surface 111 that faces the bottom side wall surface 112, from which the coil terminal 508 protrudes. Thus, the coil terminal 508 and the control terminals 509 protrude from the resin part 11 in the opposite directions. The bottom side wall surface 112 forms the protrusion surface. The V1 semiconductor module 502 is so positioned that the side wall surfaces 111 and 112 are generally perpendicular to the rotation axis of the motor 30, that is, generally parallel to the end wall 106. Each of the coil terminal 508, the control terminals 509 and the capacitor terminals 510 is provided to be perpendicular to the bus bars 16 and 17. The capacitor 702 is located on the wide-width side wall surface 115 of the resin part 11 so that its axis is parallel to the rotation axis of the motor 30.

Second Embodiment

Figure 12:
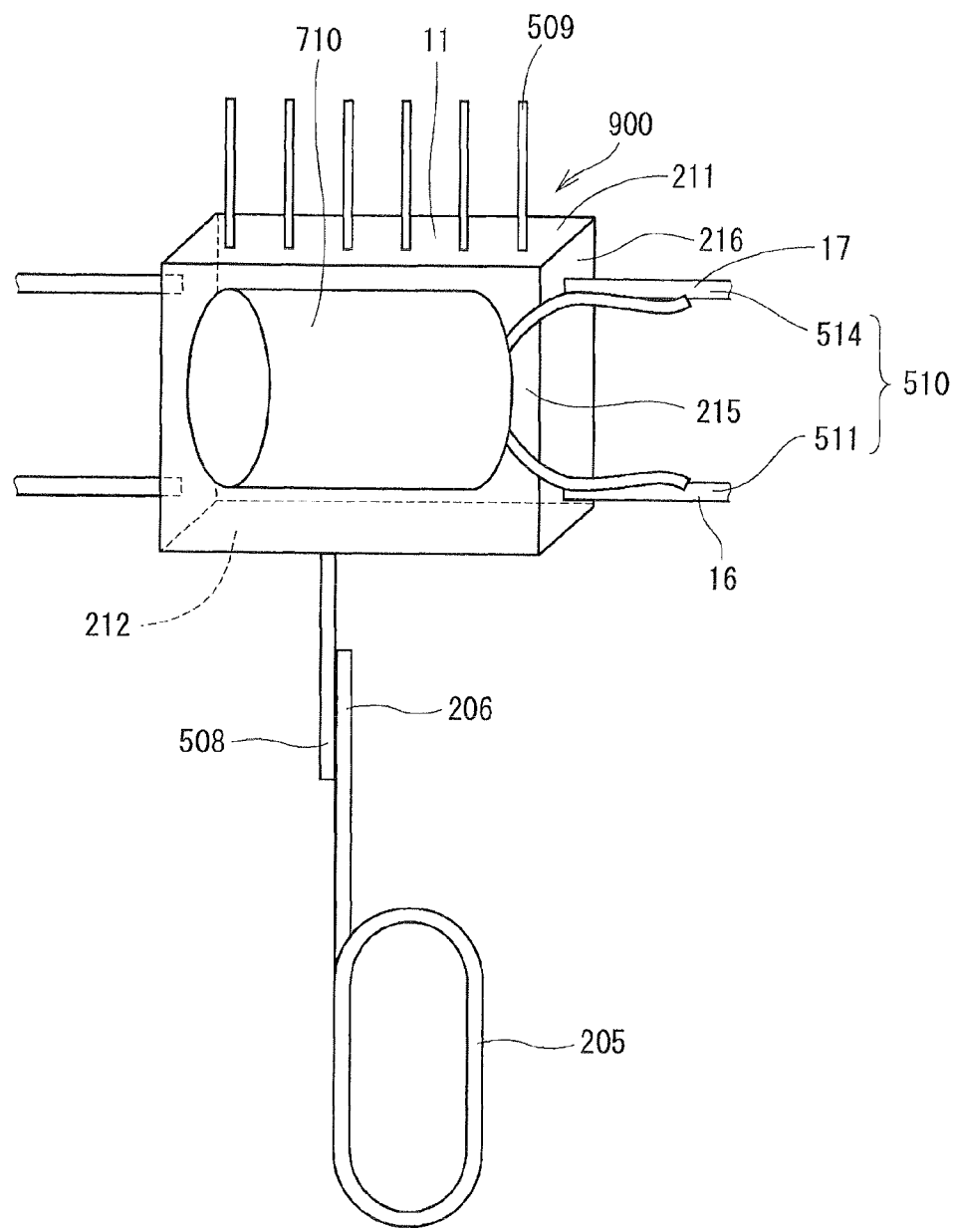
FIG. 12 is a schematic view showing a semiconductor module according to the second embodiment of the present invention.

A semiconductor module according to the second embodiment is shown in FIG. 12. In a semiconductor module 900, as shown in FIG. 12, the coil terminal 508 is protruded perpendicularly from a bottom side wall surface 212 of the resin part 11. The bottom side wall surface 212 is on the motor case 101 side (FIG. 8). The control terminals 509 protrude generally perpendicularly to the top side wall surface 211 of the resin part 11 that faces the bottom side wall surface 212, from which the coil terminal 508 protrudes. Thus, the coil terminal 508 and the control terminals 509 protrude from the resin part 11 in the opposite directions. The bottom side wall surface 212 forms the protrusion surface. The semiconductor module 900 is so positioned that its side wall surfaces 211 and 212 are generally perpendicular to the rotation axis of the motor 30.

The capacitor terminals 510 are provided generally perpendicularly to a narrow-width side wall surface 216 that is adjacent to the bottom side wall surface 212, from which the coil terminal 508 protrudes. Thus, the capacitor terminals 501 and the coil terminal 508 cross each other perpendicularly. The narrow-width side wall surface 216 is generally in parallel with the rotation axis of the motor 30. The capacitor terminals 501 include the first terminal 511 and the second terminal 514 as in the first embodiment. The first terminal 511 is directly connected to the positive terminal of the capacitor 10. The second terminal 514 is directly connected to the negative terminal of the capacitor 10.

According to this embodiment, the first terminal 511 is formed by the first bus bar 16 and the second terminal 514 is formed by the second bus bar 17. The capacitor 710 is located on the wide-width side wall surface 215 of the resin part 11 so that its axis is generally perpendicular to the rotation axis of the motor 30. The semiconductor module according to the second embodiment thus provides not only the similar advantages as the first embodiment but also an additional advantage in that it can be connected appropriately in accordance with the position of the lead wire 206 of the coil 205. Further, since the bus bars 16 and 17 also have a function of the capacitor terminals 510, the semiconductor module 900 and the capacitor 710 can be connected in the simple structure.

Third Embodiment

A semiconductor module according to the third embodiment is shown in FIG. 13. In a semiconductor module 910, as shown in FIG. 13, the coil terminal 508 protrudes perpendicularly from a bottom side wall surface 222 of the resin part 11. The bottom side wall surface 222 is on the motor case 101 side (FIG. 8). The control terminals 509 protrudes generally perpendicularly to the top side wall surface 221 of the resin part 11 that faces the bottom side wall surface 222, from which the coil terminal 508 protrudes. Thus, the coil terminal 508 and the control terminals 509 protrude from the resin part 11 in the opposite directions. The bottom side wall surface 222 forms the protrusion surface. The semiconductor module 910 is so positioned that its side wall surfaces 221 and 222 are generally perpendicular to the rotation axis of the motor 30.

The capacitor terminals 510 and the coil terminal 508 protrude from the same bottom side wall surface 222 of the resin part 11. That is, the capacitor terminals 510 and the coil terminal 508 are arranged in parallel to each other. The capacitor terminal 501 includes the first terminal 511 and the second terminal 514 as in the first embodiment. The first terminal 511 is directly connected to the positive terminal of a capacitor 711. The second terminal 514 is directly connected to the negative terminal of the capacitor 711. The capacitor 711 is located on the narrow-width side wall surface 226 of the resin part 11 so that its axis is generally parallel to the rotation axis of the motor 30.

The semiconductor module 910 according to the third embodiment thus provides not only the similar advantages as the first embodiment but also an additional advantage in that it can be connected appropriately in accordance with the position of the lead wire 206 of the coil 205. Further, a large space can be ensured on the top side wall surface 221 side, at which the capacitor 510 and the coil terminal 508 are not provided.

Fourth Embodiment

Figure 14:
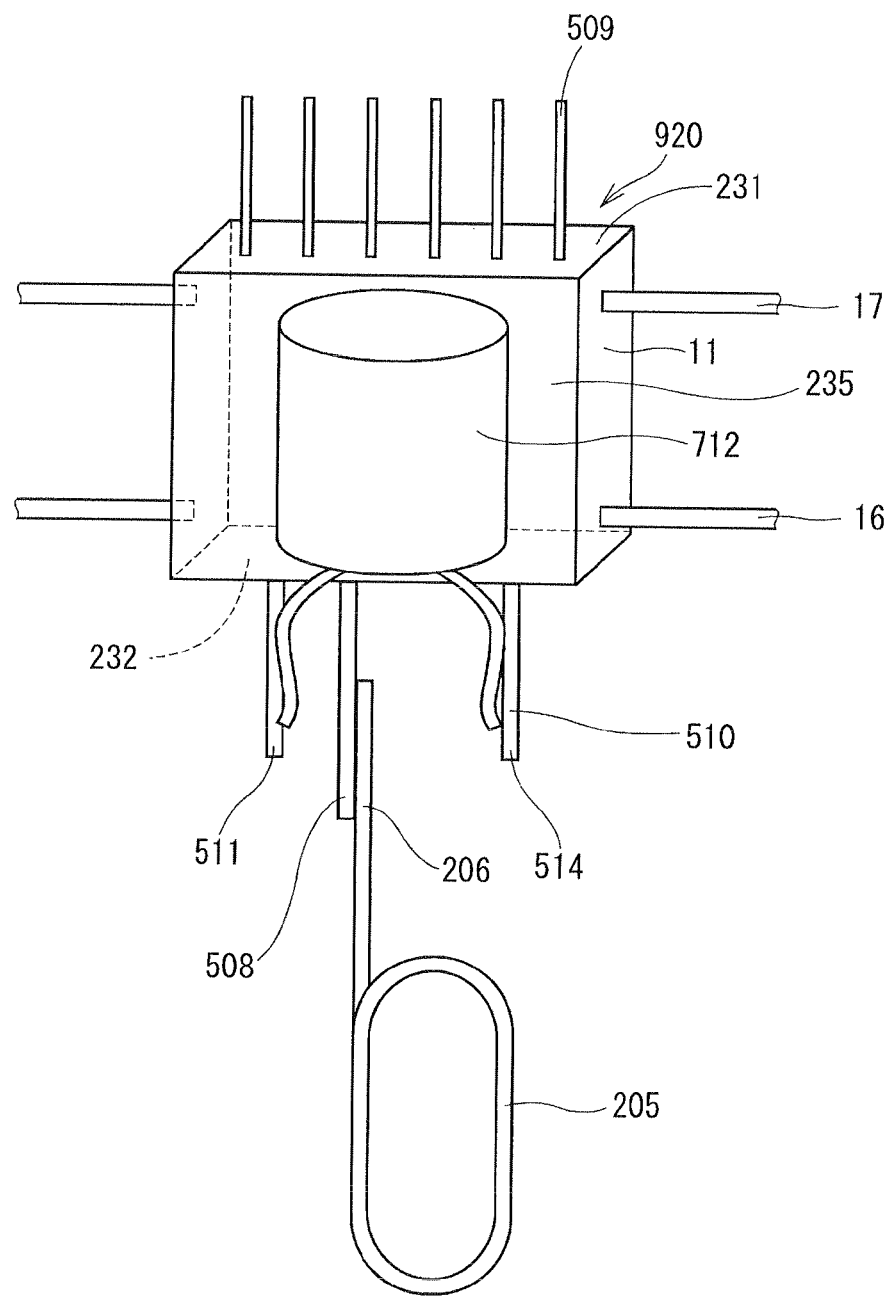
FIG. 14 is a schematic view showing a semiconductor module according to the fourth embodiment of the present invention.

A semiconductor module according to the fourth embodiment is shown in FIG. 14. In a semiconductor module 920, as shown in FIG. 14, the coil terminal 508 protrudes generally perpendicularly from a bottom side wall surface 232 of the resin part 101. The bottom side wall surface 232 is on the motor case 101 side (FIG. 8). The control terminals 509 protrudes generally perpendicularly from a top side wall surface 231 of the resin part 11 that faces the bottom side wall surface 232, from which the coil terminal 508 protrudes. Thus, the coil terminal 508 and the control terminals 509 protrude from the resin part 11 in the opposite directions. The bottom side wall surface 232 forms the protrusion surface. The semiconductor module 920 is so positioned that the side wall surfaces 231 and 232 are generally perpendicular to the rotation axis of the motor 30.

The capacitor terminals 510 and the coil terminal 508 are provided to be on the same bottom side wall surface 232 of the resin unit 11. The capacitor terminals 510 and the coil terminal 508 are thus positioned in parallel to each other. The capacitor terminals 510 include the first terminal 511 and the second terminal 514 as in the first embodiment. The first terminal 511 is directly connected to the positive terminal of the capacitor 712 and the second terminal 514 is directly connected to the negative terminal of the capacitor 712. The capacitor 712 is located on a wide-width side wall surface 235 of the resin part 11 so that its axis is generally in parallel to the rotation axis of the motor 30.

The semiconductor module according to the fourth embodiment thus provides not only the similar advantages as the first embodiment but also an additional advantage in that it can be connected appropriately to the terminal of the capacitor 712 in accordance with the position of the lead wire 206 of the coil 205. Further, a large space can be ensured on the top side wall surface 231 side, at which the capacitor 510 and the coil terminal 508 cannot be provided.

Fifth Embodiment

Figure 15:
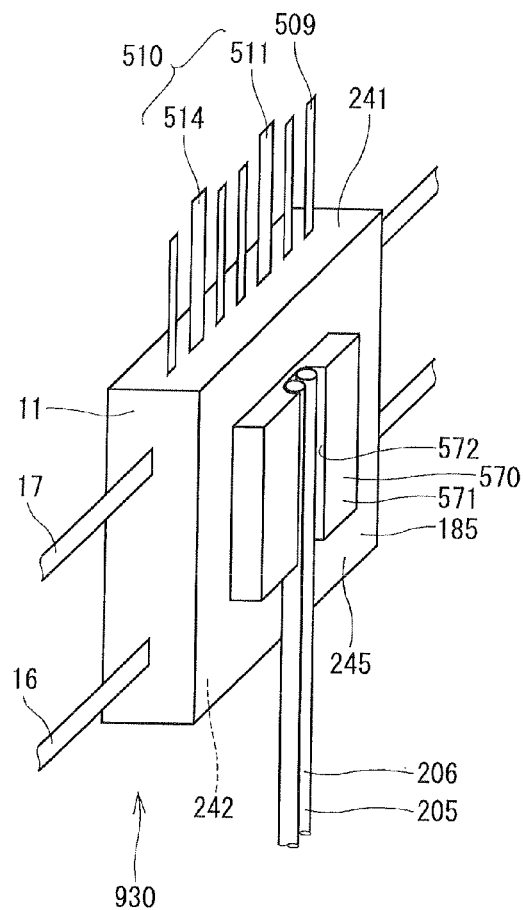
FIG. 15 is a schematic view showing a semiconductor module according to the fifth embodiment of the present invention.
Figure 16:
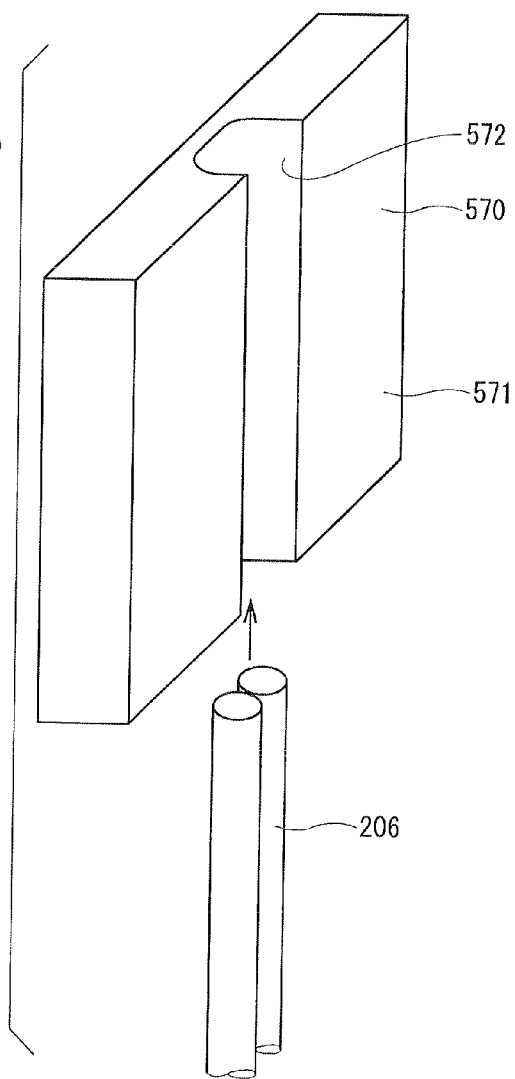
FIG. 16 is a schematic view showing a state of winding a coil on the semiconductor module according to the fifth embodiment.

A semiconductor module according to the fifth embodiment is shown in FIGS. 15 and 16.

In a semiconductor module 930 according to the fifth embodiment, as shown in FIG. 15, a coil terminal 570 protrudes from a wide-width side wall surface 245 of the resin part 11. The control terminals 509 and the capacitor terminals 510 protrude generally perpendicularly from the side wall surface 241, which is at the opposite side to the motor case 101. The side wall surface 241 is adjacent to the wide-width side wall surface 245, from which the coil terminal 570 protrudes. The control terminals 509 and the capacitor terminals 510 are both provided to protrude in the direction perpendicular to the bus bars 16 and 17. The semiconductor module 930 is so positioned that its side wall surface 241 is generally perpendicular to the rotation axis of the motor 30 and its wide-width side wall surface 245 is generally parallel to the rotation axis of the motor 30.

The coil terminal 570 is formed similarly as the heat dissipation part 569 in the first embodiment. The coil terminal 570 is press-formed to protrude a land in the direction opposite to the mounting face, on which the semiconductor chip is mounted. The land is formed of conductive material. The terminal 570 protrudes from the wide-width side wall surface 245 of the resin part 11. A protruded end face 571, which is formed in parallel to the wide-width side wall surface 245 of the coil terminal 570, is formed to be inside the wide-width side wall surface 245. A groove 572 is formed on the protruded end face 571. The groove 572 is provided to open in the direction opposite to the resin part 11. In this embodiment, the groove 572 is formed to pass through the side wall surface 241 side and the side wall surface 242 side. As shown in FIGS. 15 and 16, the lead wire 206 of the coil 205 is inserted into the groove 572. The lead wire 206 inserted into the groove 572 is joined to the coil terminal 570 by soldering. The lead wire 206 is thus electrically connected to the coil terminal 570.

The coil terminal 570 contacts the heat sink 601 (FIG. 8) through a heat radiating insulation sheet. As a result, the coil terminal 570 and the lead wire 206 are electrically connected to each other and electrically insulated from the heat sink 601. Since the coil terminal 570 is in surface-contact with the heat sink 601 through the heat radiating insulation sheet, heat radiation is promoted. The coil terminal 570 thus forms a heat dissipation part in this embodiment. The semiconductor module 930 according to the fifth embodiment thus provides not only the similar advantages as the first embodiment but also an additional advantage in that the configuration is simplified because the coil terminal 570 and the heat dissipation part need not be formed separately.

<Shape of Coil Terminal>

In the first embodiment, the coil terminal 508 is configured to have the droop part 581, the intermediate part 582, the rise part 583 and the clamp part 584. Further, the intermediate part 582 is formed in the L-shape, which extends from the outer side in the radial direction in the direction of circumference. The coil terminal 508 is not limited to such a configuration but may be formed in other shapes as shown in the sixth embodiment to the ninth embodiment.

Sixth Embodiment

A semiconductor module according to the sixth embodiment is shown in FIGS. 17A, 17B, 17C and 18.

A semiconductor module 941 has a coil terminal 810, which protrudes generally perpendicularly from the bottom side wall surface 112 of the resin part 11. The bottom side wall surface 112 is on the motor case 101 side (FIG. 7). The coil terminal 810 is positioned to be perpendicular to the bus bars 16 and 17. The coil terminal 810 is displaced from the center in the width direction of the bottom side wall surface 112 (in the lateral direction in FIG. 17A). According to this embodiment, the coil terminal 810 is formed in generally perpendicularly bent shape. That is, the coil terminal 810 is bent in the bottom direction, left direction, top direction and right direction, for example in FIG. 17A. The lead frame is best utilized without wasting much.

Figure 17A:
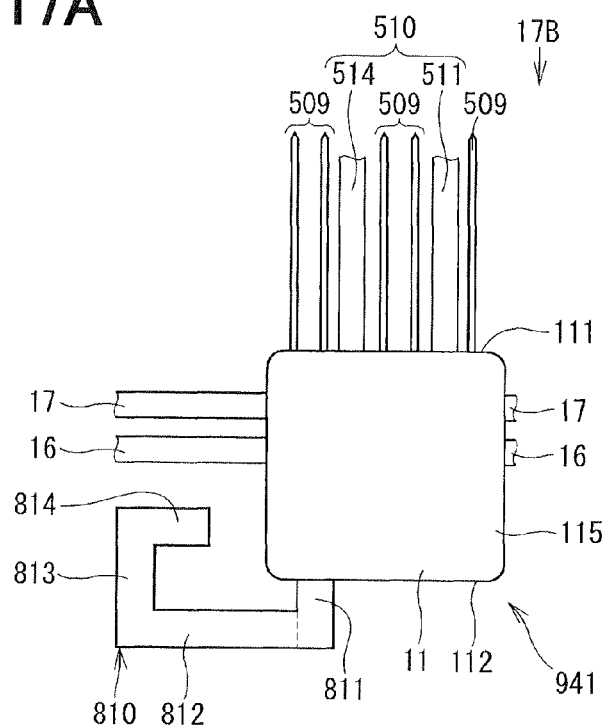
FIG. 17A is a schematic plan view showing the semiconductor module according to the sixth embodiment of the present invention.
Figure 17B:
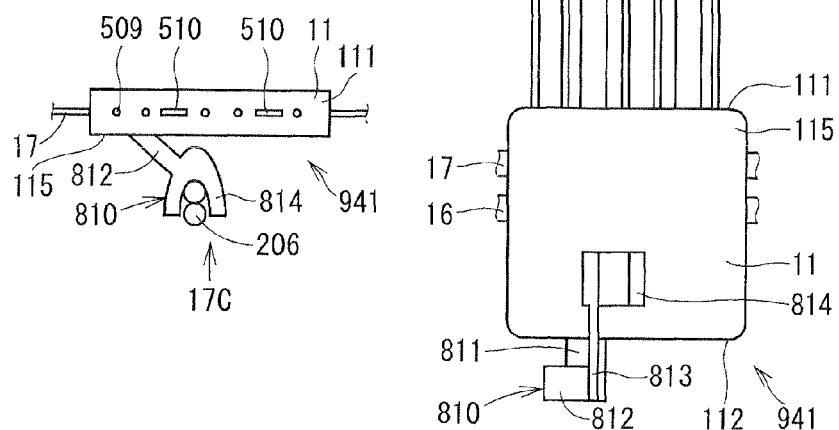
FIG. 17B is a side view showing the semiconductor module viewed in the direction 17B in FIG. 17A.
Figure 17C:
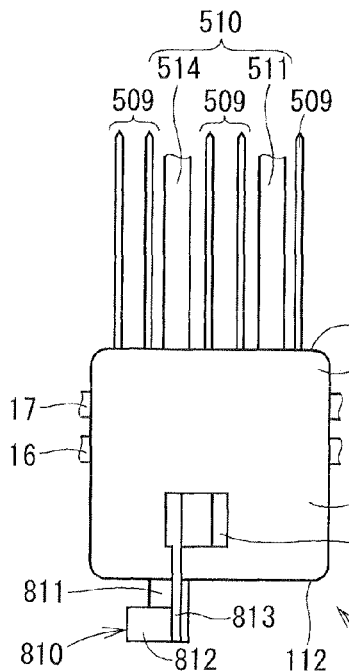
FIG. 17C is a bottom plan view showing the semiconductor module viewed in the direction 17C in FIG. 17B.

The coil terminal 810 is bent at a position indicated by a broken line in FIG. 17A to clamp the lead wire 206 of the coil 205 as shown in FIG. 17B. The coil terminal 810 is formed of a droop part 811, an intermediate part 812, a rise part 813 and a clamp part 814. The droop part 811 protrudes from the bottom side wall surface 112 of the resin part 11 generally in parallel with the axis of the rotation shaft of the motor 30. The intermediate part 12 is bent from the droop part 811 in the outer side in the radial direction. According to this embodiment, the intermediate part 812 is bent to form an acute angle relative to the wide-width side wall surface 195 of the resin part 11 so that the clamp part 814 may be positioned to clamp the lead wire 206. The rise part 813 is raised in the direction to be distanced away from the motor case 101. The clamp part 814 is formed at the top end of the rise part 813 and bent in the U-shape to provide an opening, which is open in the radially outer side, that is, in the radially outer direction. The clamp part 814 clamps the lead wire 206 to be electrically connected. The coil terminal 810 and the lead wire 206 is directly connected to each other by direct contact. As shown in FIG. 17C, the clamp part 814 is formed thicker than the droop part 811, the intermediate part 812 and the rise part 813.

Figure 18:
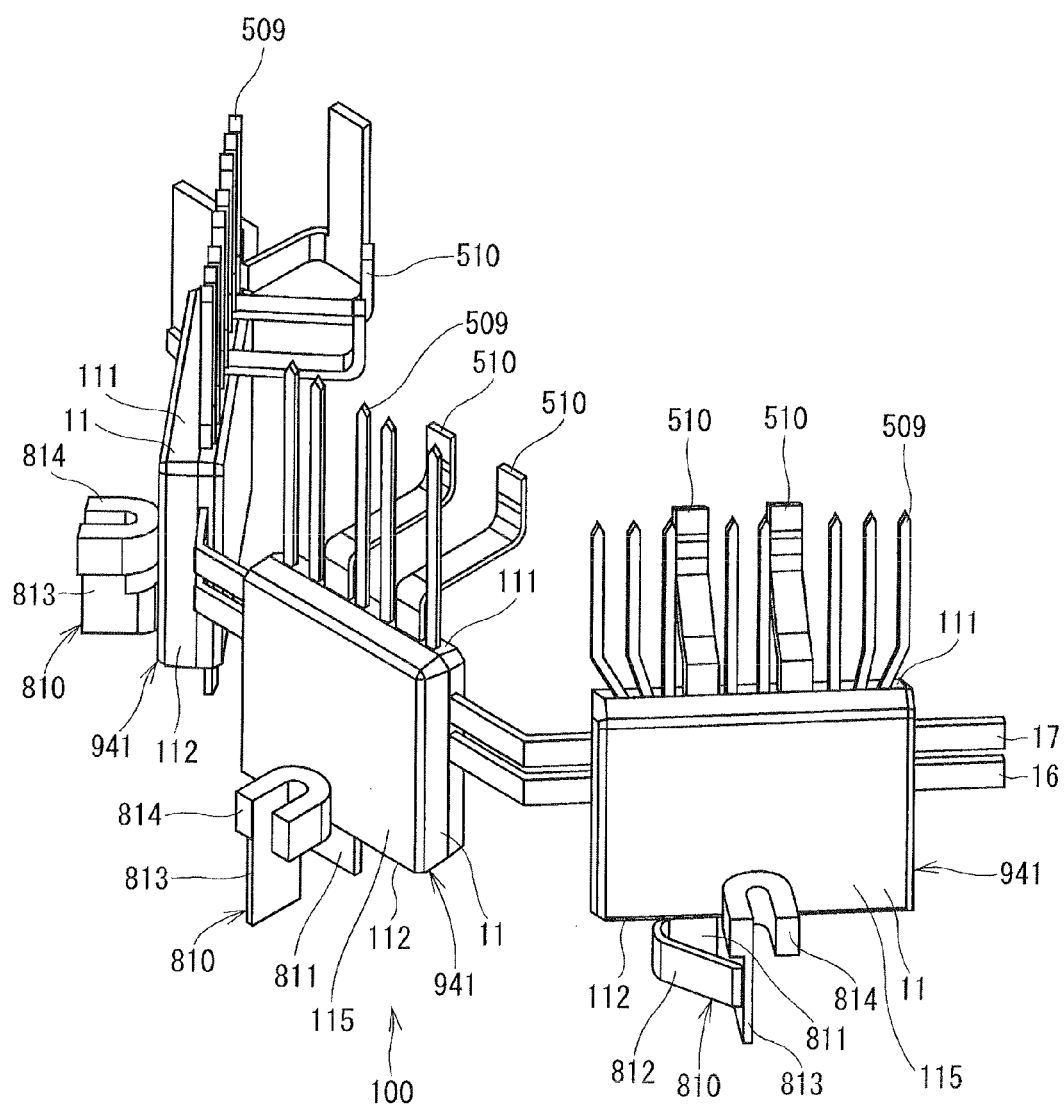
FIG. 18 is a perspective view showing the semiconductor modules according to the sixth embodiment, which are linked and arranged in a motor device.

As shown in FIG. 18, a linked semiconductor module unit 100, which is formed of a plurality of the semiconductor modules 941, is arranged in the perpendicularly so that the bottom side wall surface 112, from which the coil terminal 810 protrudes, is on the motor case 101 side. The bus bars 16 and 17 are bent and arranged not to surface-contact the heat sink, which is not shown. The semiconductor module 941 is so arranged that its surfaces 111 and 112 are generally perpendicular to the rotation axis of the motor 30. The semiconductor module according to the sixth embodiment thus provides not only the similar advantages as the first embodiment but also an additional advantage in that wasting of the lead frame is reduced.

Seventh Embodiment

Figure 19A:
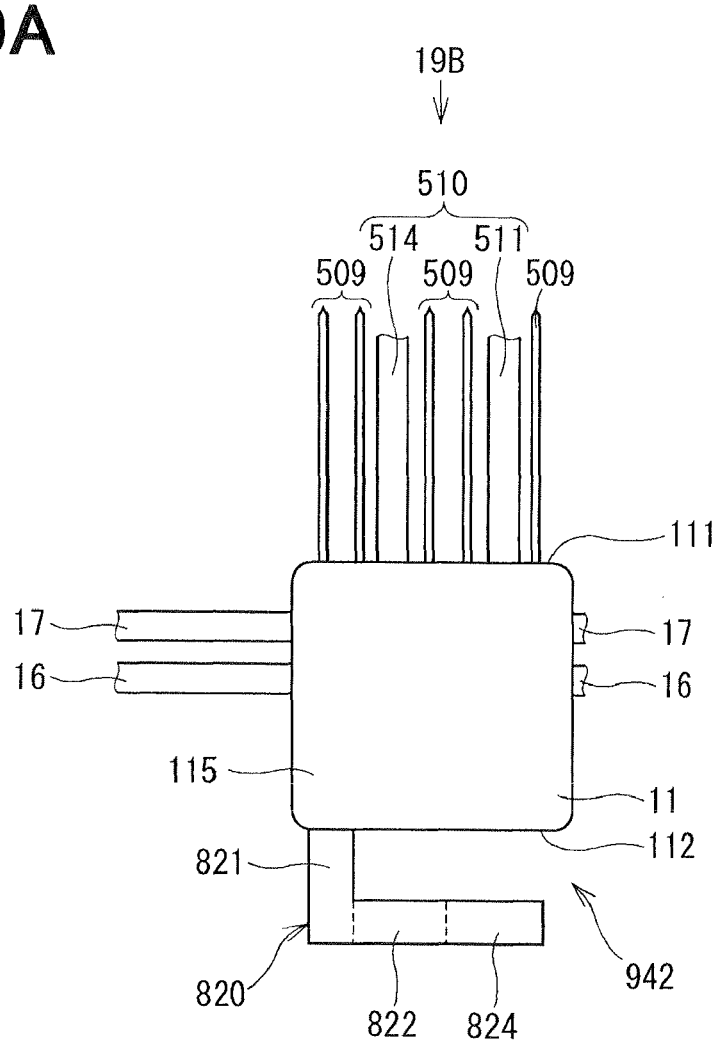
FIG. 19A is a schematic plan view showing a semiconductor module according to the seventh embodiment of the present invention.
Figure 19B:
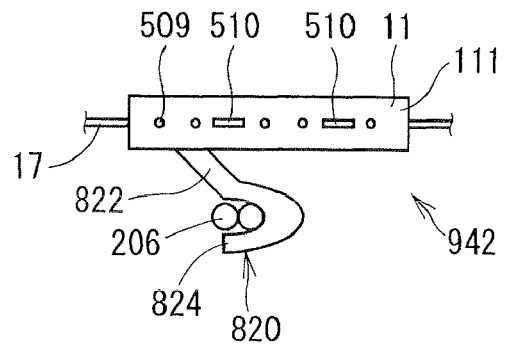
FIG. 19B is a side view showing the semiconductor module viewed in the direction 19B in FIG. 19A.

A semiconductor module according to the seventh embodiment is shown in FIGS. 19A and 19B.

A semiconductor module 942 has a coil terminal 820, which protrudes generally perpendicularly from the bottom side wall surface 112 of the resin part 11. The bottom side wall surface 112 is on the motor case 101 side (FIG. 7). The coil terminal 820 is displaced from the center in the width direction of the bottom side wall surface 112 (in the lateral direction in FIG. 19A). According to this embodiment, the coil terminal 820 is formed in the L-shape before being bent.

The coil terminal 820 is bent at a position indicated by a broken line in FIG. 19A to clamp the lead wire 206 of the coil 205 as shown in FIG. 19B, when the semiconductor module 942 is so arranged perpendicularly in the electronic circuit-integrated motor device 1 that the side wall surfaces 111 and 112 are generally perpendicular to the rotation axis of the motor 30. The coil terminal 820 is formed of a droop part 821, an intermediate part 822 and a clamp part 824. The droop part 821 protrudes from the bottom side wall surface 112 of the resin part 11 generally in parallel with the axis of the rotation shaft of the motor 30. The intermediate part 822 is bent from the droop part 821 in the outer side in the radial direction. According to this embodiment, the intermediate part 822 is bent to form an acute angle relative to the wide-width side wall surface 195 of the resin part 11 so that the clamp part 824 may be positioned to clamp the lead wire 206. The clamp part 824 is formed at the top end of the intermediate part 822 and bent in the U-shape to provide an opening, which is open in the direction parallel to the wide-width side wall surface 195. The clamp part 824 clamps the lead wire 206 to be electrically connected. The coil terminal 820 and the lead wire 206 is directly connected to each other by direct contact. The semiconductor module according to the seventh embodiment thus provides the similar advantages as the first embodiment.

Eighth Embodiment

Figure 20A:
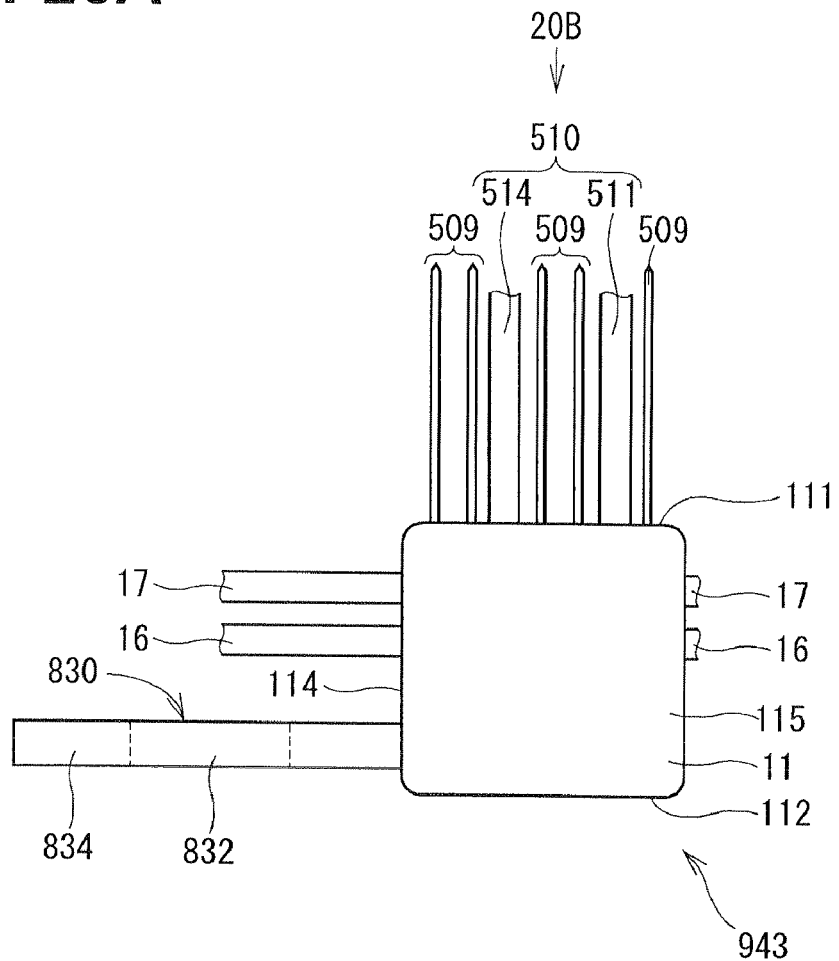
FIG. 20A is a schematic plan view showing a semiconductor module according to the eighth embodiment of the present invention.
Figure 20B:
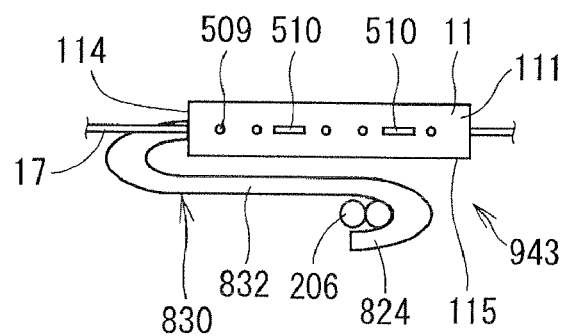
FIG. 20B is a side view showing the semiconductor module viewed in the direction 20B in FIG. 20A.

A semiconductor module according to the eighth embodiment is shown in FIGS. 20A and 20B.

The semiconductor module 943 has a coil terminal 830, which protrudes generally perpendicularly from the narrow-width side wall surface 194 of the resin part 11. The narrow-width side wall surface 194 is parallel with the axial direction of the motor 30. The coil terminal 830 is positioned in parallel with the bus bars 16 and 17. The coil terminal 830 is displaced from the center in the height direction of the side wall surface 114 (in the longitudinal direction in FIG. 20A). According to this embodiment, the coil terminal 830 is formed generally in the straight line shape before being bent. The coil terminal 830 is bent at a position indicated by a broken line in FIG. 20A to clamp the lead wire 206 of the coil 205 as shown in FIG. 20B, when the semiconductor module 943 is so arranged longitudinally in the electronic circuit-integrated motor that the side wall surfaces 111 and 112 are generally perpendicular to the rotation axis of the motor 30. The coil terminal 830 is formed of an intermediate part 832 and a clamp part 834.

The intermediate part 832 is folded back in generally the reverse direction relative to the side wall surface 114 of the resin part 11, from which the intermediate part 832 protrudes, so that the clamp part 834 may be positioned to clamp the lead wire 206. The clamp part 834 is bent to provide an opening, which is open in the direction parallel to the wide-width side wall surface 115. The clamp part 834 clamps the lead wire 206 to be electrically connected. The coil terminal 830 and the lead wire 206 is directly connected to each other by direct contact. As shown in FIG. 20B, the coil terminal 830 is bent in generally the S-shape, when viewed in the axial direction. The semiconductor module according to the eighth embodiment thus provides the similar advantages as the first embodiment.

Ninth Embodiment

Figure 21A:
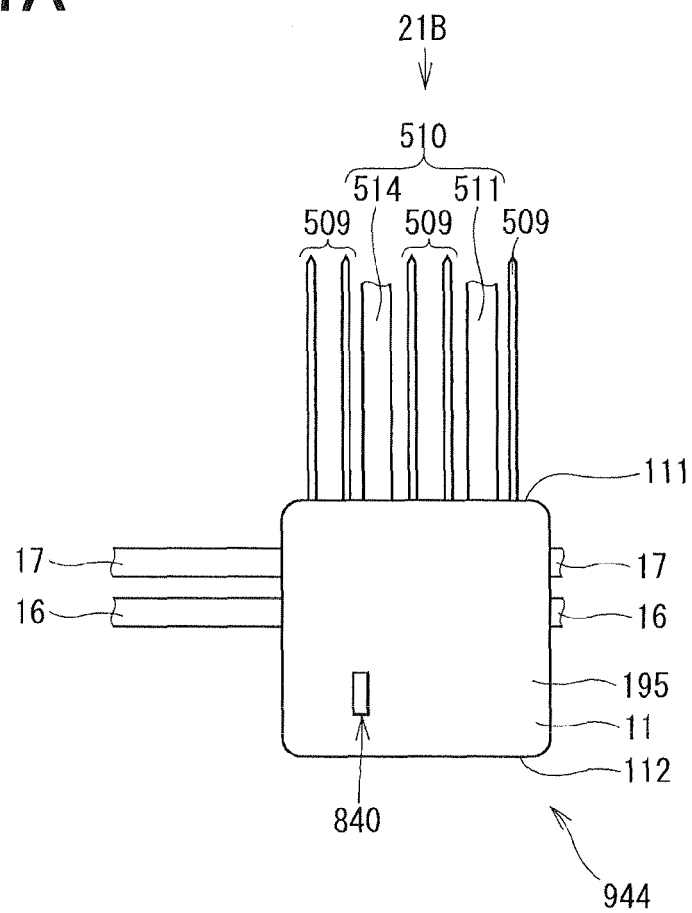
FIG. 21A is a schematic plan view showing a semiconductor module according to the ninth embodiment of the present invention.
Figure 21B:
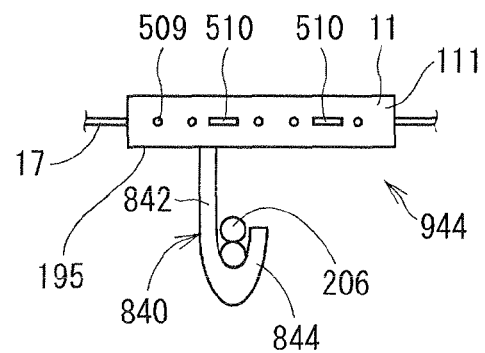
FIG. 21B is a side view showing the semiconductor module viewed in the direction 21B in FIG. 21A.

A semiconductor module according to the ninth embodiment is shown in FIGS. 21A and 21B.

A semiconductor module 944 has a coil terminal 840, which protrudes generally perpendicularly from a wide-width side wall surface 195 of the resin part 11. The wide-width side wall surface 195 is in parallel with the axial direction of the motor 30. The coil terminal 840 is positioned generally perpendicularly to the axial direction the motor 30, when the semiconductor module 944 is arranged perpendicularly. The coil terminal 840 is generally perpendicular to the bus bars 16 and 17. The coil terminal 840 is displaced from the center in the width direction of the resin unit 11 (in the lateral direction in FIG. 21A). According to this embodiment, the coil terminal 840 is formed generally in the straight line shape before being bent. The coil terminal 840 is bent to clamp the lead wire 206 of the coil 205 as shown in FIG. 21B, when the semiconductor module 944 is so arranged longitudinally in the electronic circuit-integrated motor 1 that the side wall surfaces 111 and 112 are generally perpendicular to the rotation axis of the motor 30.

The coil terminal 840 is formed of an intermediate part 842 and a clamp part 844. The clamp part 844 is bent to provide an opening, which is open in the direction toward the resin part 11. The clamp part 844 clamps the lead wire 206 to be electrically connected. The coil terminal 840 and the lead wire 206 are directly connected to each other by direct contact. As shown in FIG. 21B, the coil terminal 840 is bent in generally the J-shape, when viewed in the axial direction. The semiconductor module according to the ninth embodiment thus provides the similar advantages as the first embodiment.
<Arrangement of Capacitor>

The capacitors 701 to 706 are arranged inside the semiconductor modules 501 to 506 in the radial direction in the first embodiment. The capacitors 701 to 706 may be arranged radially outside the semiconductor modules 501 to 506 as exemplified in the following tenth to twelfth embodiments.

Tenth Embodiment

Figure 22:
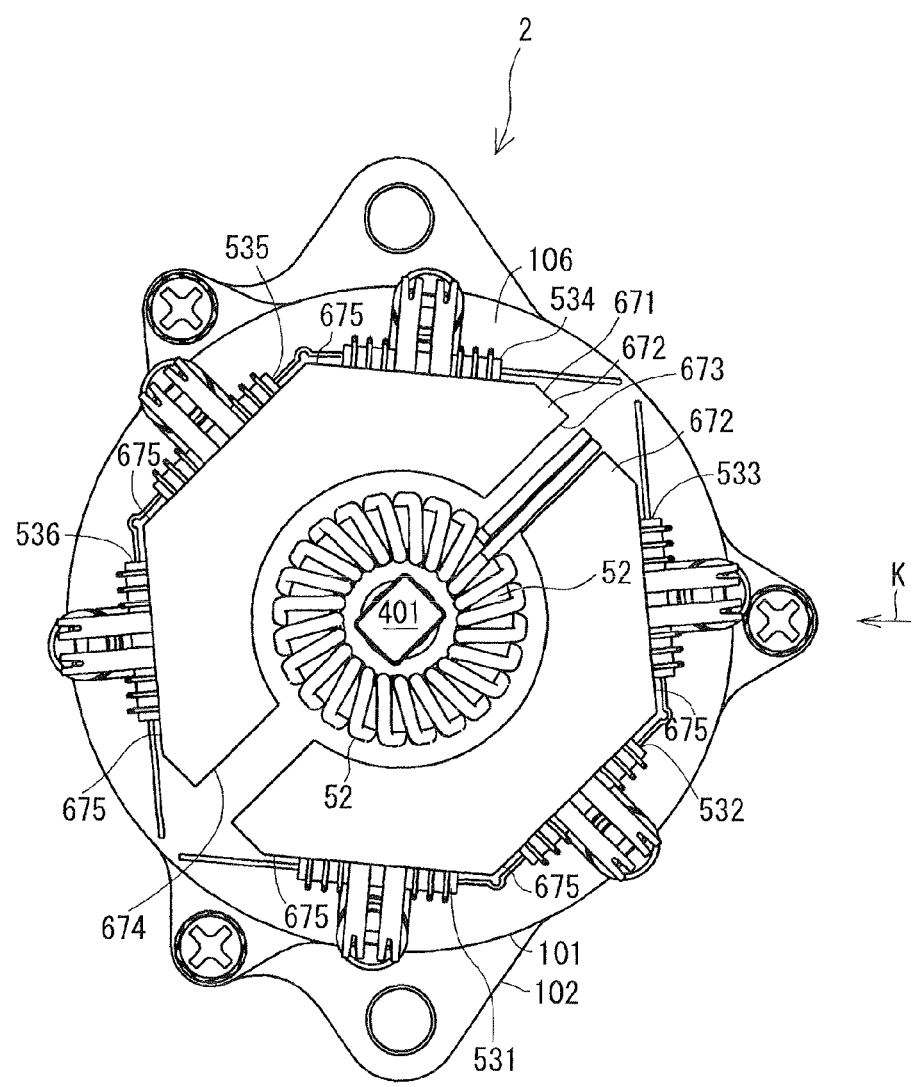
FIG. 22 is a plan view showing an electronic circuit-integrated motor device according to the tenth embodiment of the present invention.
Figure 23:
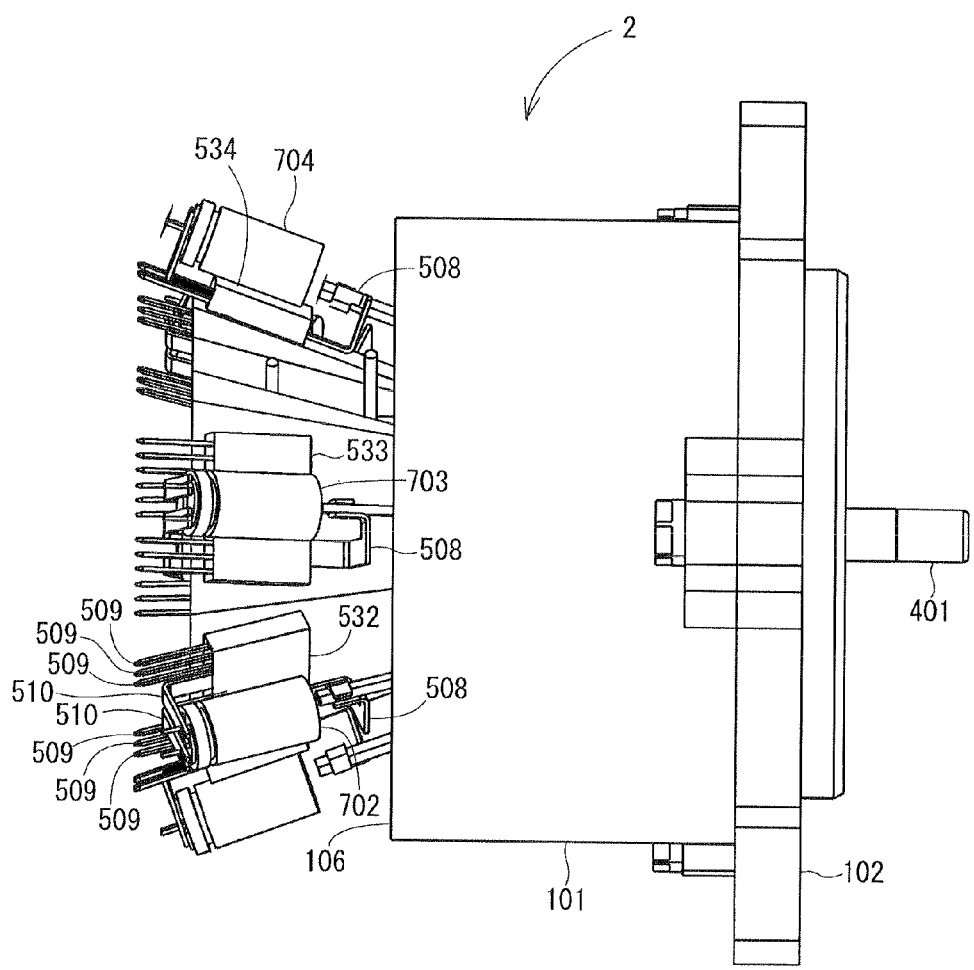
FIG. 23 is a side view showing the electronic circuit-integrated motor device according to the tenth embodiment.
Figure 24:
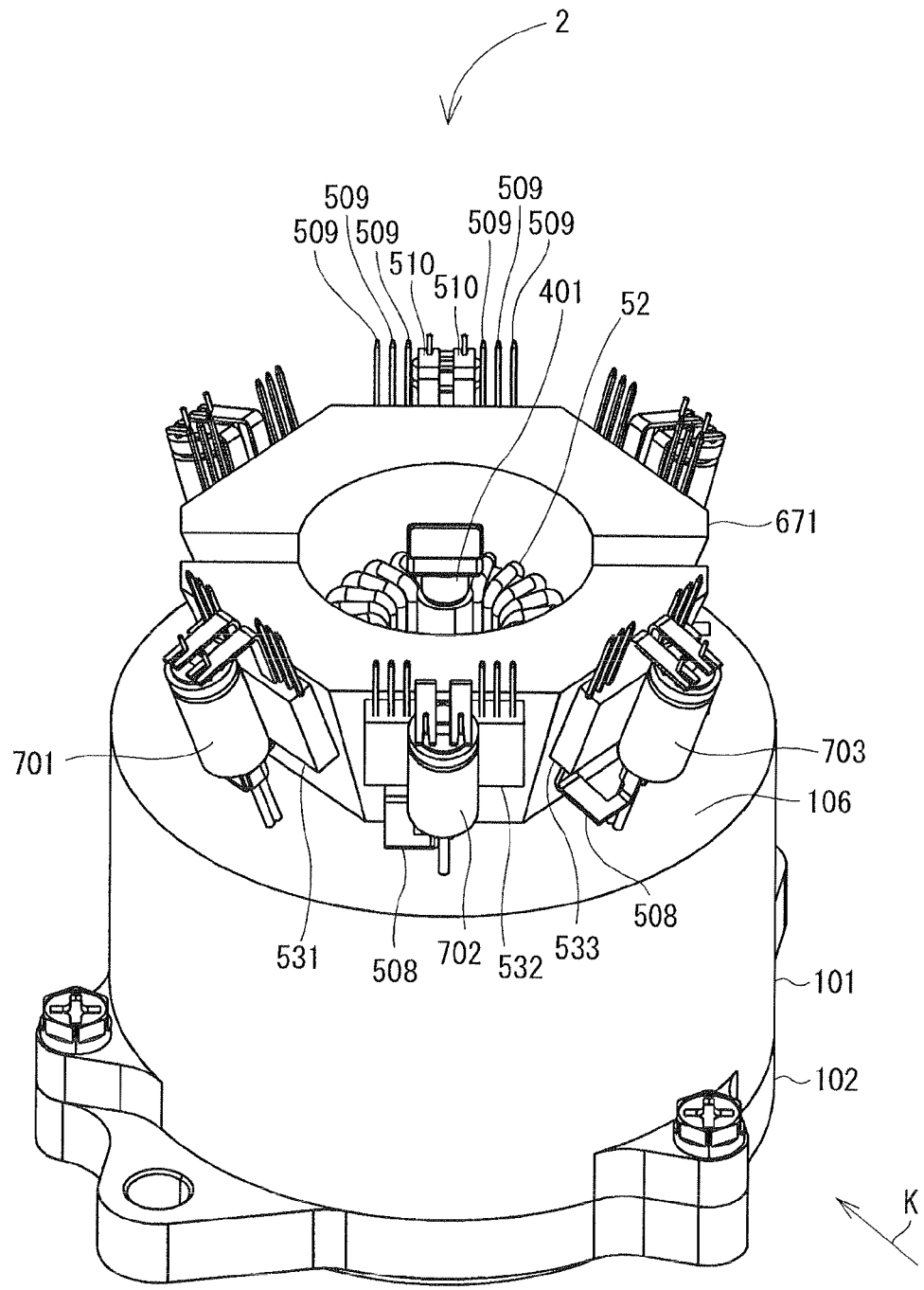
FIG. 24 is a perspective view showing the electronic circuit-integrated motor device according to the tenth embodiment.

An electronic circuit-integrated motor device according to the tenth embodiment is shown in FIGS. 22 to 24, in which the cover, the printed circuit board and the bus bars are not illustrated.

As shown in FIG. 22, a motor device 2 includes six semiconductor modules 531, 532, 533, 534, 535, 536. The semiconductor modules 531 to 536 are attached to a heat sink 671, which is raised from the axial end wall 106 of the motor case 101 in the same direction as that of the central axis of the shaft 401.

The heat sink 671 includes two columnar members, which are shaped in generally the trapezoid in cross-section taken in a direction perpendicular to the axial direction. The two columnar members are arranged to face each other through the central axis of the shaft 401. Each of the columnar members has a semi-cylindrical though hole, which is elongated in the axial direction and semi-circular in section. The columnar members thus provide a cylindrical through hole in the radial center. This heat sink 671 is different from the heat sink 601 (FIG. 5) in that the radially outer wall surface is inclined relative to the central axis of the shaft 401 so that the wall surface is more distanced away from the central axial line of the shaft 401 as the wall surface is distanced away more from the motor case 101. That is, the heat sink 671 is shaped in the truncated pyramid, which has the top surface parallel to the bottom surface on the motor case 101 side. The heat sink 671 has side walls 672 about the central axis of the shaft 401. Two cuts 673 and 674 are formed on the side wall 672. The cuts 673 and 674 provide a discontinuous part.

The side wall 672 of the heat sink 671 has six side wall surfaces 675, which face in the radially outward direction. The side wall surfaces 675 are inclined. The semiconductor modules 531 to 536 are arranged on the side wall surfaces 675 facing in the radially outward direction relative to the heat sink 671. The semiconductor modules 531 to 536 are arranged with respective heat dissipation surfaces being in contact with the side wall surfaces 675. The side wall surfaces 675 are planar and hence the heat dissipation surfaces of the semiconductor modules 531 to 536 are also planar correspondingly. Since the semiconductor modules 531 to 536 are arranged on the side wall surfaces 675 of the heat sink 671, the semiconductor modules 531 to 536 are inclined relative to the central axis of the shaft 401.

Each of the semiconductor modules 531 to 536 has the coil terminal 508 at one end part, which is on the motor case 101 side, as shown in FIGS. 23 and 24. Each of the semiconductor modules 531 to 536 has six control terminals 509 and two capacitor terminals 510 at the other end part, which is opposite to the motor case 101 side.

The coil terminal 508, the control terminals 509 and the capacitor terminals 510 are arranged in the similar manner as in the first embodiment. As shown in FIG. 24, six capacitors 701, 702, 703, 704, 705, 706 are provided at one side wall surfaces of the semiconductor modules 531 to 536, respectively, which are opposite to the heat sink 671.

The capacitors 701 to 706 are located adjacent to the semiconductor modules 531 to 536, respectively. The capacitors 701 to 706 are in the cylindrical shape and inclined along the semiconductor modules 531 to 536. The capacitor terminals 510 of the semiconductor modules 531 to 536 are bent in the radially outward direction. The terminals of the capacitors 701 to 706 are directly connected to the capacitor terminals 510, which are bent.

A choke coil 52 is provided in the state that the shaft 401 is fitted in the motor case 101. The choke coil 52 is formed of a doughnut-shaped iron core and a coil winding wound about it. The coil end of the choke coil 52 is led out in the radially outward direction from one of the cut parts 673 of the heat sink 671 as shown in FIG. 22.

The electronic circuit-integrated motor device 2 according to this embodiment provides the following advantages in addition to the advantages provided by the first embodiment.

Since the semiconductor modules 531 to 536 are arranged in the inclined manner relative to the central axis of the motor 30, the size of the motor device 2 can be reduced in size in the axial direction. The side wall surfaces 675 of the heat sink 671 are so slanted that the side wall surfaces 675 are more distanced away from the central axis of the shaft 401 as it is more distanced from the end wall 106 of the motor case 101. As a result, a space can be ensured near the end wall 106 of the motor case 101. Further, the capacitors 701 to 706 are arranged relative to the semiconductor modules 531 to 536, respectively, at the side opposite to the heat sink 671. That is, the capacitors 701 to 706 are positioned radially outside the semiconductor modules 701 to 706, while the heat sink 671 is positioned radially inside the semiconductor modules 701 to 706. Thus, the heat sink 671 is not required to be shaped to have parts for accommodating the capacitors 701 to 706.

Eleventh Embodiment

Figure 25:
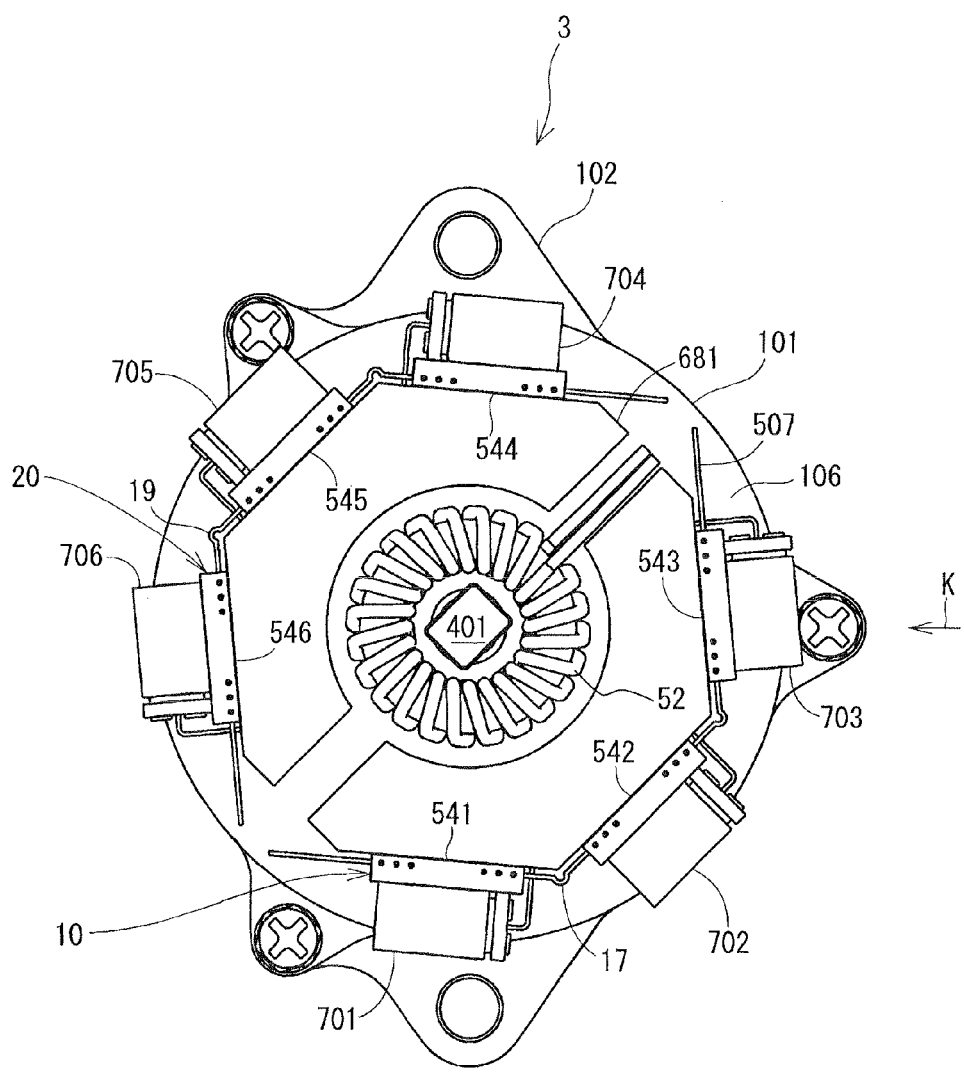
FIG. 25 is a plan view showing an electronic circuit-integrated motor device according to the eleventh embodiment of the present invention.
Figure 26:
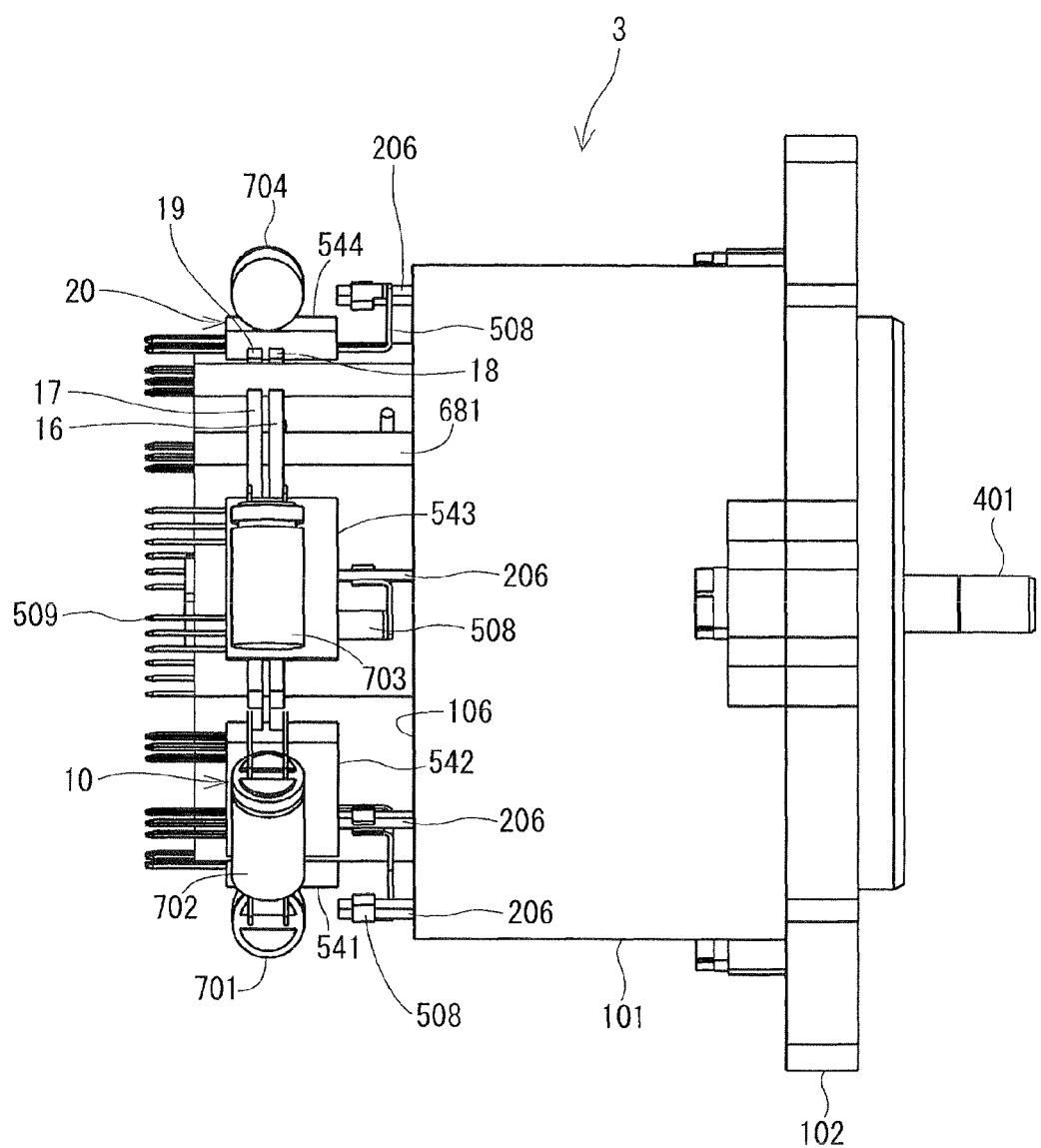
FIG. 26 is a side view showing the electronic circuit-integrated motor device according to the eleventh embodiment.
Figure 27:
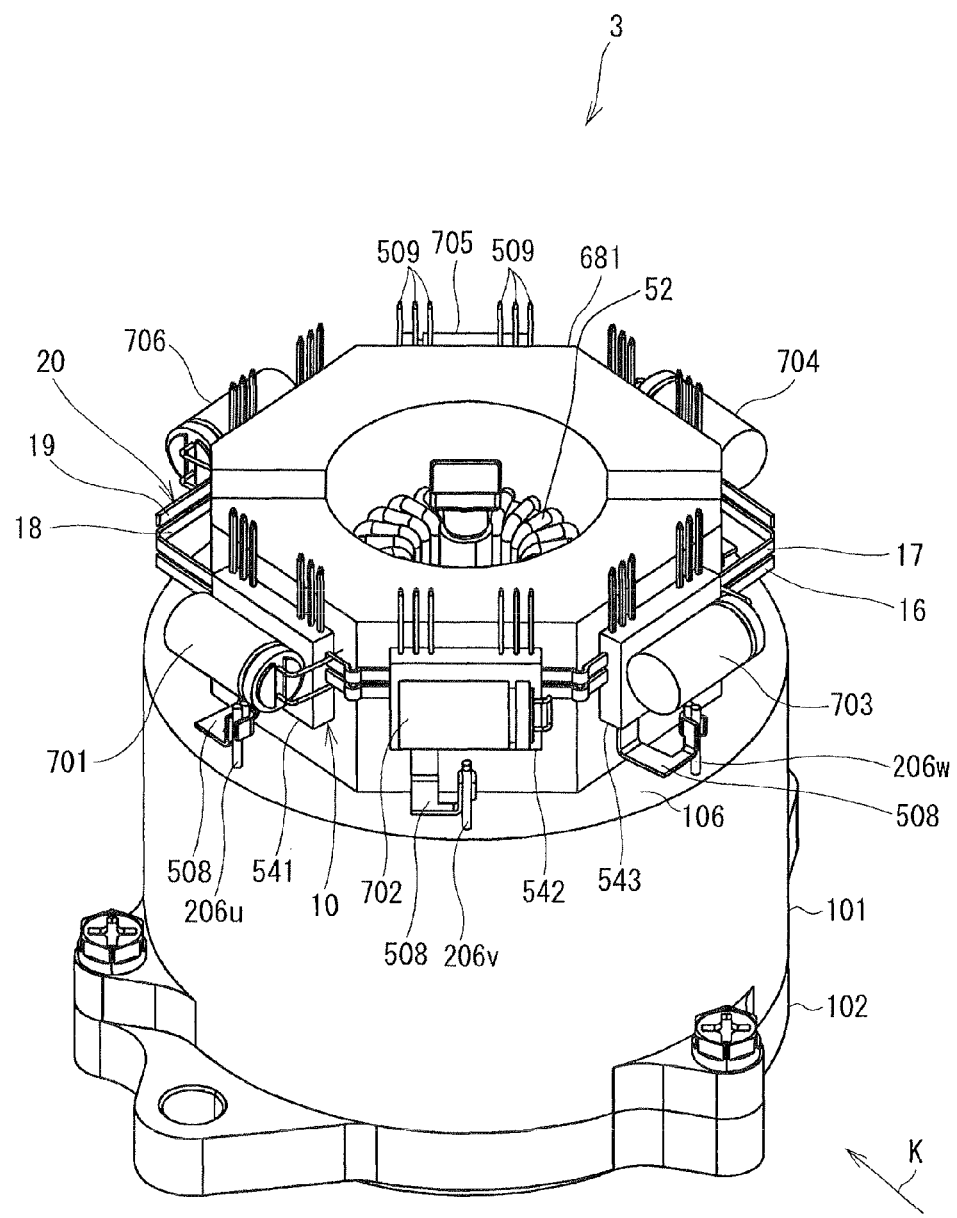
FIG. 27 is a perspective view showing the an electronic circuit-integrated motor device according to the eleventh embodiment.

An electronic circuit-integrated motor device according to the eleventh embodiment is shown in FIGS. 25 to 27, in which the cover and the printed circuit board are not illustrated.

This embodiment embodies the semiconductor module 900 according to the second embodiment shown in FIG. 12. As shown in FIG. 25, an electronic circuit-integrated motor device 3 includes six semiconductor modules 541, 542, 543, 544, 545, 536. The semiconductor modules 541 to 546 are attached to a heat sink 681, which is raised from the axial end wall 106 of the motor case 101 in the same direction as that of the central axis of the shaft 401. Six capacitors 701, 702, 703, 704, 705, 706 are provided laterally at one sides of the semiconductor modules 541 to 546, respectively, which are opposite to the heat sink 671. That is, the axis of each capacitor 701 to 706 extends perpendicularly to the central axis of the shaft 401.

The capacitors 701 to 706 are arranged oppositely to the heat sink 681. That is, the capacitors 701 to 706 are located radially outside the semiconductor modules 541 to 546, respectively. The terminals of the capacitors 701 to 706 are directly connected to the bus bars 16 to 19, which are also used as the power supply lines. No capacitor terminals are provided on the radially outside wall surfaces of the semiconductor modules 541 to 546, that is, on the surfaces, which receive the capacitors 701 to 706 thereon. The coil terminal 508 and the control terminals 509 are arranged in generally the same manner as in the first embodiment.

The electronic circuit-integrated motor device 3 according to the eleventh embodiment provides the similar advantages as the first and the second embodiments. In the motor device 3, in particular, the capacitors 701 to 706 are located perpendicularly to the central axis of the shaft 401 near the semiconductor modules 541 to 546, that is, in the circumferential direction of the shaft 401. The capacitors 701 to 706 are located outside the semiconductor modules 541 to 546 in the radial direction. The heat sink 681 therefore is not required to have the part for accommodating the capacitors 701 to 706. The capacitors 701 to 706 are directly connected through the terminals thereof to the bus bars 16 to 19 of the semiconductor modules 541 to 546. As a result, wiring between the semiconductor modules 541 to 546 and the capacitors 701 to 706 can be shortened and hence the capacitors 701 to 706 can exhibit respective performance fully.

Since the capacitor terminals are not required, the motor device 3 can be simplified in configuration. Each of the capacitors 701 to 706 is provided for corresponding one of the semiconductor modules 541 to 546. Each capacitor 701 to 706 can be reduced to be relatively small in capacity and in size.

Twelfth Embodiment

Figure 29:
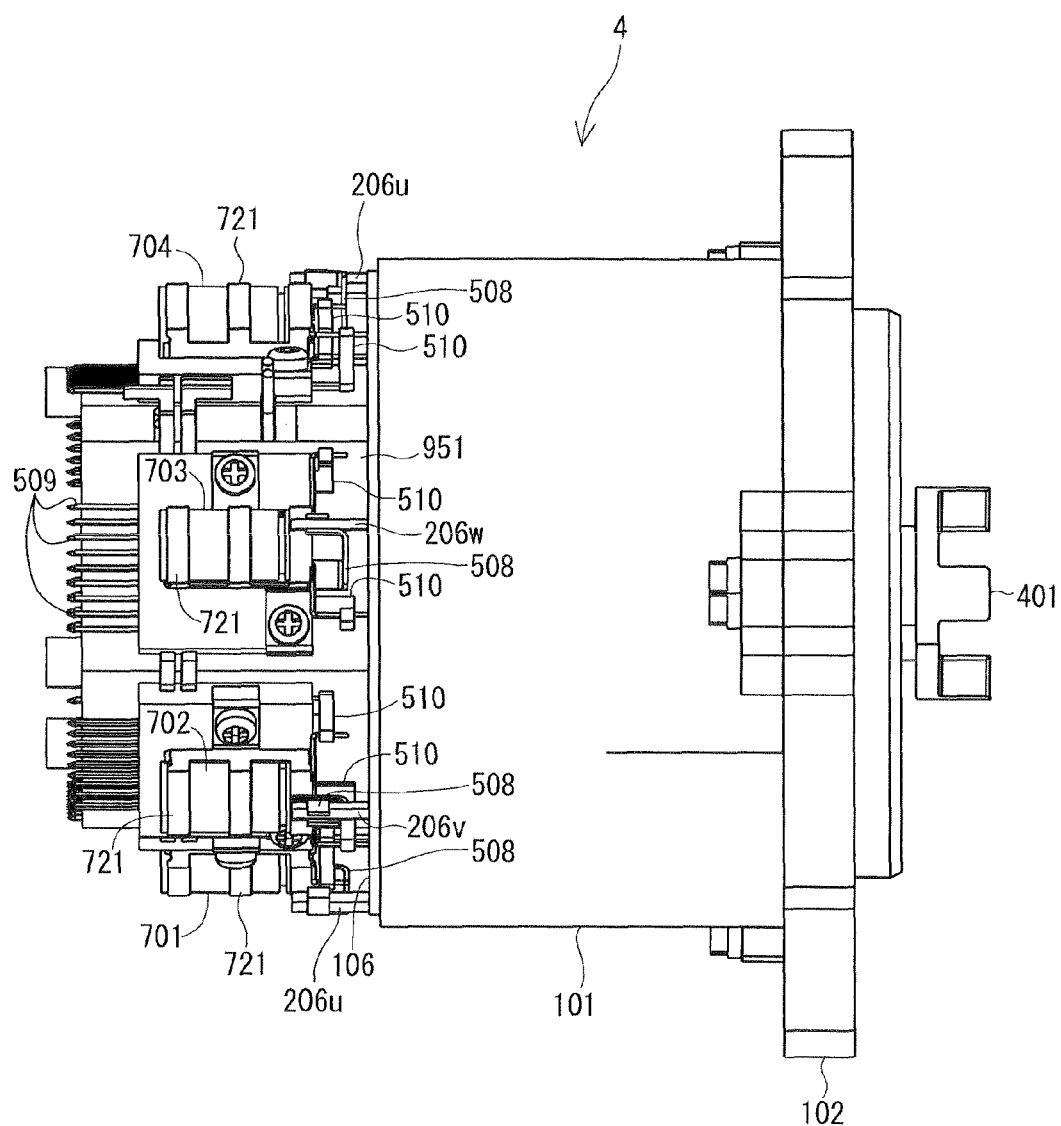
FIG. 29 is a side view showing the electronic circuit-integrated motor device according to the twelfth embodiment.
Figure 30:
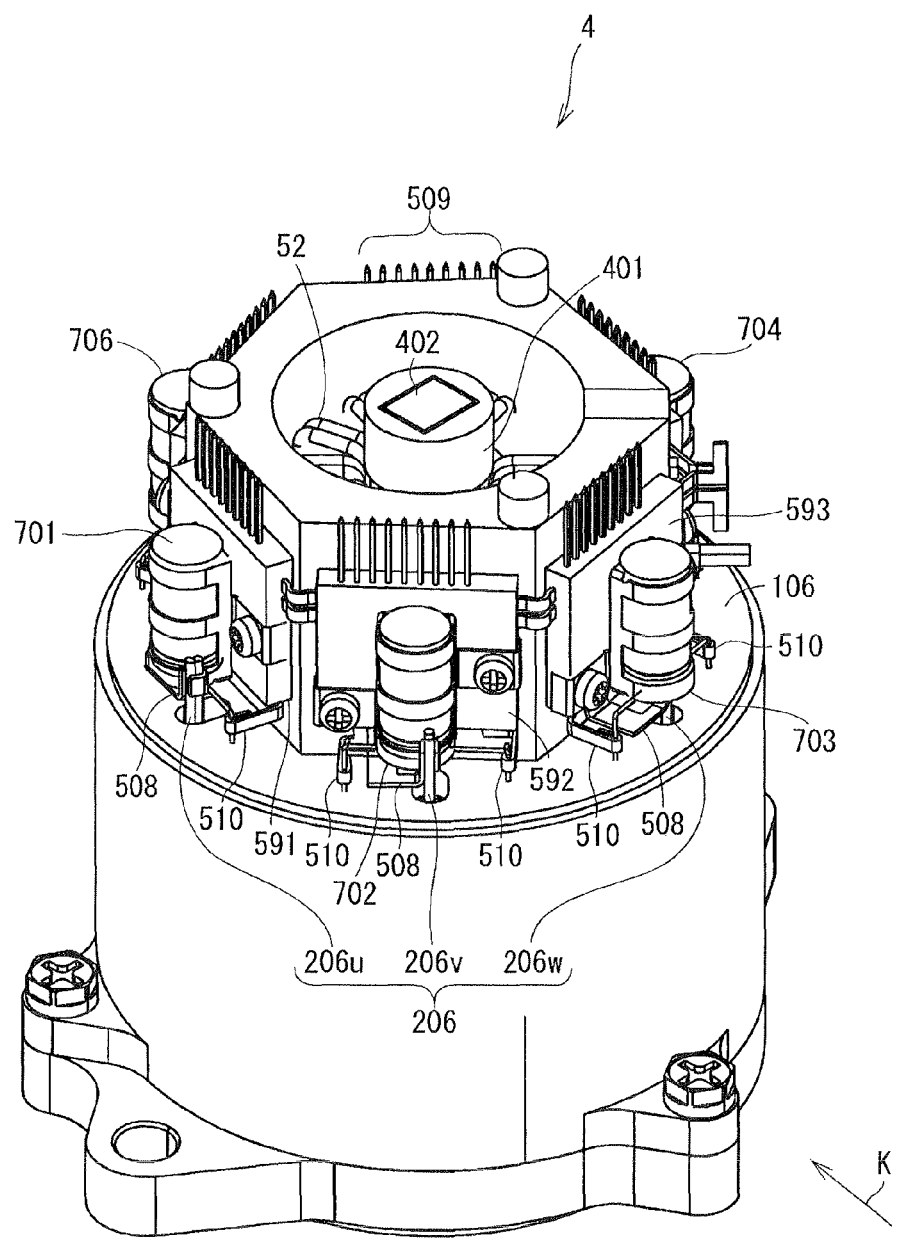
FIG. 30 is a perspective view showing the electronic circuit-integrated motor device according to the twelfth embodiment.

An electronic circuit-integrated motor device 4 according to the twelfth embodiment embodies the semiconductor module 920 according to the fourth embodiment shown in FIG. 14. This electronic circuit-integrated motor device 4 is shown in FIGS. 28 to 30, in which the cover and the printed circuit board are not illustrated.

Figure 28:
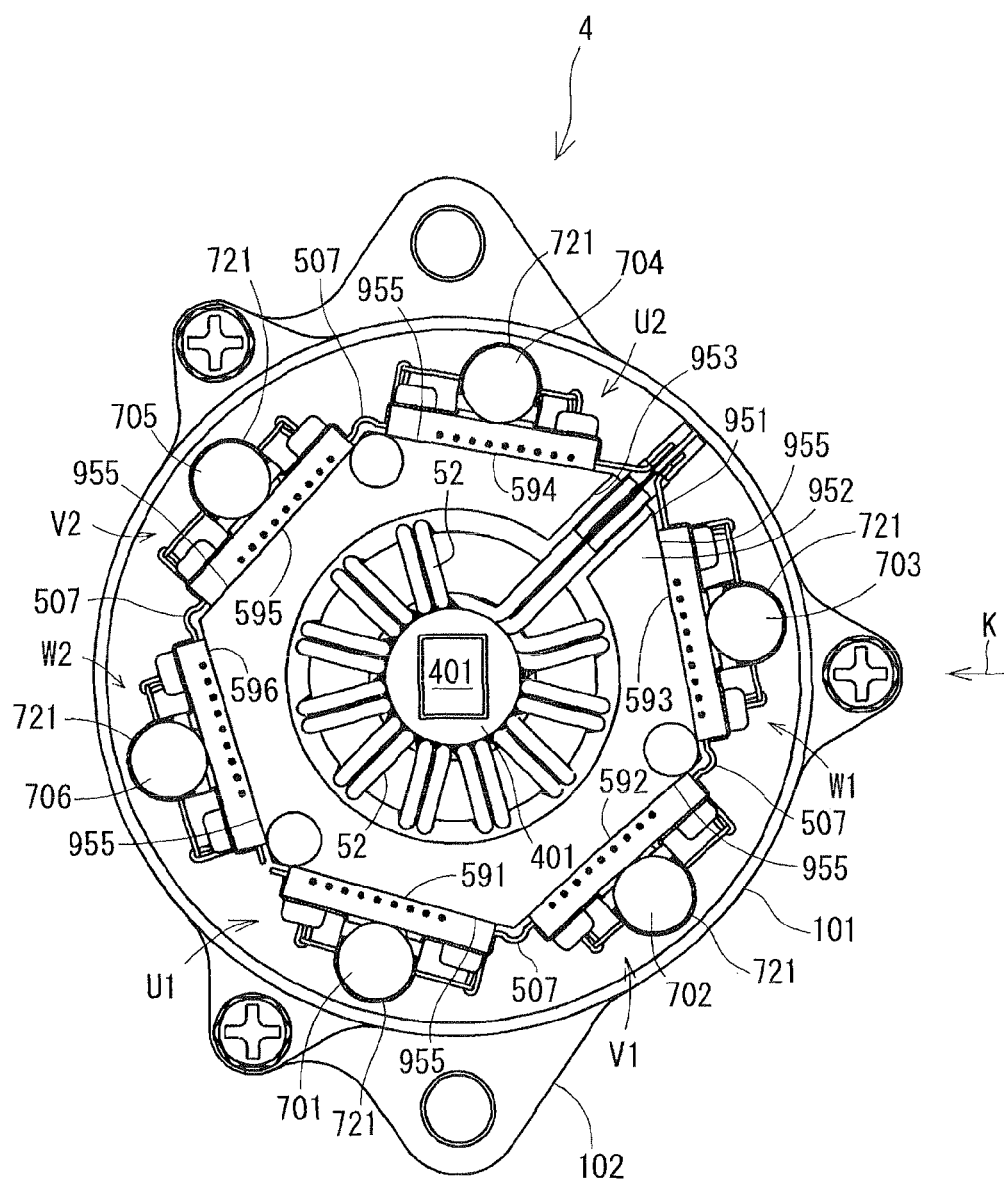
FIG. 28 is a plan view showing an electronic circuit-integrated motor device according to the twelfth embodiment of the present invention.

As shown in FIG. 28, the electronic circuit-integrated motor device 4 includes six semiconductor modules 591, 592, 593, 594, 595, 596. The semiconductor modules 591 to 596 are referred to as a U1 semiconductor module 591, a V1 semiconductor module 592, a W1 semiconductor module 593, a U2 semiconductor module 594, a V2 semiconductor module 595 and a W2 semiconductor module 596, respectively.

The three U1 to W1 semiconductor modules 591 to 593 and the three U2 to W2 semiconductor modules 594 to 596 are linked by the bus bars 16 to 19 to form a semiconductor module unit. The bus bars 16 to 19 are used not only as a link member but also as the power supply line.

The semiconductor modules 591 to 596 are attached to a heat sink 951, which is raised from the axial end wall 106 of the motor case 101 in the same direction as that of the central axis of the shaft 401.

As shown in FIG. 28, the heat sink 951 is shaped in generally a hexagonal column, which has a hexagon shape in cross section transverse to the axial direction. The heat sink 951 has a cylindrical hole, which extends in the axial direction in the radially central part. A cut part 953, which forms a discontinuous part is formed on a side wall 952 of the heat sink 951. Since the heat sink 951 is in generally the hexagonal column shape, the heat sink 951 has six side wall surfaces 955, which faces radially outward direction, on its periphery.

The semiconductor modules 591 to 596 are positioned to face the six side wall surfaces 955 of the heat sink 951, respectively. Each heat dissipation surface of the semiconductor modules 591 to 596 is in contact with the side wall surface 955. Since the side wall surface 955 is planar, each heat dissipation surface of the semiconductor modules 591 to 596 is also planar correspondingly to ensure tight contact.

Since the semiconductor modules 591 to 596 are arranged on the side wall surfaces 955 of the heat sink 951, the perpendicular line of the semiconductor chip surface is perpendicular to the central line of the shaft 401.

Each of the semiconductor modules 591 to 596 has the capacitor terminals 510 on its side wall, which faces the motor case 101, that is, which is on the motor case 101 side. Each of the semiconductor modules 591 to 596 has nine control terminals 509 on its another side wall, which is opposite to the motor case 101 side. Each of the semiconductor modules 591 to 596 has two capacitor terminals 510. One of the capacitor terminals 510 is bent to clamp the positive terminal of the corresponding capacitor 701 to 706 to provide an electric connection. The other of the capacitor terminals 510 is also bent to clamp the negative terminal of the corresponding capacitor 701 to 706 to provide an electric connection. Specifically, the capacitor terminals 510 of the semiconductor module protrude from the resin part 11 toward the motor case 101 and bends in the radially outward direction. The top end part of the capacitor terminals 510 bends back in the radially inward direction to provide an opening, which is open toward the resin part 11. Thus, the capacitor terminals 510 hold and clamp the lead wires in the opening. The capacitor terminals 510 are bent in the J-shape, when viewed in the axial direction. The coil terminal 508 and the capacitor terminals 510 protrude from the resin part 11 in one direction (motor case 101 side), while the control terminals 509 protrude in the other direction (counter motor case 101 side), which is opposite to the one direction. The coil terminal 508, the control terminals 509 and the capacitor terminals 510 are provided to protrude in the direction perpendicular to the bus bars 16 and 17.

As shown in FIG. 28, the six capacitors 701, 702, 703, 704, 705, 706 are located for the modules 591 to 596 on the sides of the semiconductor modules 591 to 596, which are opposite to the heat sink 951. The capacitors 701 to 706 are located outside the semiconductor modules 591 to 596 in the radial direction. The capacitors 701 to 706 are fixed by respective mounting tabs made of metal.

The capacitors 701 to 706 are located adjacently to the corresponding semiconductor modules 591 to 596, respectively. Each capacitor 701 to 706 is in the cylindrical shape and oriented so that its axis is in parallel to the central axis of the shaft 401. The terminals of each capacitor 701 to 706 are connected to the corresponding capacitor terminals 510 of each semiconductor module 591 to 596.

The choke coil 52 is provided around the shaft 401 inserted in the motor case 101. The choke coil 52 has the doughnut-shaped iron core and the coil winding wound about the iron core. The coil end of the choke coil 52 is led out from the cut part 953 of one heat sink 951 in the radially outer direction.

The twelfth embodiment provides the similar advantages as the first and the fourth embodiment. In the motor 4 according to this embodiment, in particular, the capacitors 701 to 706 are arranged on the radially outer side wall surfaces of the semiconductor modules 591 to 596, respectively. As a result, the heat sink 951 is not required to be formed accommodation parts for the capacitors 701 to 706.

Other Embodiments

Although the three semiconductor modules are linked by the first and the second bus bars, the number of the linked semiconductor modules need not be plural but may be one. An arbitrary number of semiconductor modules may be linked as the application may be. For example, a number of semiconductor modules may be linked in correspondence to the number of set of coils. The position and the number of terminals may be varied arbitrarily in accordance with each semiconductor module.

Although each semiconductor module 501 to 506 is arranged to be in the perpendicular direction to the central axis of the motor 30, which is longitudinal, the semiconductor modules may be arranged in the lateral direction. In the arrangement in the lateral direction, the perpendicular line of the semiconductor chip surface is parallel to the central axis of the shaft 401. For example, in the first embodiment, the semiconductor modules 501 to 506 may be so arranged that the heat dissipation surfaces of the semiconductor modules 501 to 506 contact the axial end wall 106 of the motor case 101, under the state that the heat sink 601 raised from the end part of the motor case 101 in the central axis direction of the shaft 401 is not provided.

The linked semiconductor packages, which are provided exemplarily in the electronic circuit-integrated motor device of the electric power steering system for a vehicle in the foregoing embodiments, may be applied to other devices and systems. The present invention is particularly preferably applied to devices and systems, in which a large current is supplied to a semiconductor package.

The present invention is not limited to the disclosed embodiments but may be implemented differently as other embodiments.

What is claimed is:

1. A semiconductor module for driving a motor, comprising:
   a semiconductor chip including switching elements that switches over supply of a current to a coil of the motor in driving the motor;
   a land mounting the semiconductor chip thereon;
   a resin part sealing the semiconductor chip and embedding the land therein;
   a coil terminal protruded from the resin part and directly connectable to the coil;
   control terminals protruded from the resin part and connectable to a printed circuit board, which includes a control circuit for controlling the supply of current to the coil;
   capacitor terminals protruded from the resin part and directly connectable to a capacitor, which is provided outside the resin part; and
   a link member including an embedded part, which is embedded in the resin part, and an exposed part, which is exposed from the resin part,
   wherein the exposed part is formed integrally and contiguously with an embedded part of another semiconductor module,
   wherein the capacitor terminals are protruded perpendicularly to the link member, and
   wherein the coil terminal and the control terminals are provided on different wall surfaces of the resin part.

2. The semiconductor module according to claim 1, wherein:
   the coil terminal and the control terminals are protruded in opposite directions from different side wall surfaces of the resin part, which face each other.

3. The semiconductor module according to claim 1, wherein:
   the coil terminal and the control terminals are protruded from different wall surfaces of the resin part, which are adjacent to each other.

4. The semiconductor module according to claim 1, wherein:
   the coil terminal and the capacitor terminals are protruded from different side wall surfaces of the resin part, which face each other.

5. The semiconductor module according to claim 1, wherein:
   the coil terminal and the capacitor terminals are protruded from different wall surfaces of the resin part, which are adjacent to each other.

6. The semiconductor module according to claim 1, wherein:
   the coil terminal and the capacitor terminals are protruded from both ends of a same wall surface of the resin part; and
   the capacitor is located to face a narrow-width side wall surface of the resin part.

7. The semiconductor module according to claim 1, wherein:
   the coil terminal and the capacitor terminals are protruded from a same wall surface of the resin part; and
   the capacitor is located to face a wide-width side face of the resin part.

8. The semiconductor module according to claim 1, wherein:
   the capacitor terminals have a first terminal and a second terminal; and
   the first terminal and the second terminal are connected a positive terminal and a negative terminal of the capacitor, respectively.

9. The semiconductor module according to claim 1, wherein:
the capacitor terminals have cut parts, each of which is cut out in a U-shape at a top end part of the capacitor terminals.

10. The semiconductor module according to claim 1, wherein:
the coil terminal is protruded perpendicularly to the link member.

11. The semiconductor module according to claim 1, further comprising:
a link member including an embedded part, which is embedded in the resin part, and an exposed part, which is exposed from the resin part;
wherein the exposed part is formed integrally and contiguously with an embedded part of another semiconductor module, and
wherein the coil terminal is protruded perpendicularly to the link member.

12. The semiconductor module according to claim 1, wherein:
the land includes a heat dissipation part exposed from the resin part.

13. A semiconductor module for driving a motor, comprising:
a semiconductor chip including switching elements that switches over supply of a current to a coil of the motor in driving the motor;
a land mounting the semiconductor chip thereon;
a resin part sealing the semiconductor chip and embedding the land therein;
a coil terminal protruded from the resin part and directly connectable to the coil;
control terminals protruded from the resin part and connectable to a printed circuit board, which includes a control circuit for controlling the supply of current to the coil;
capacitor terminals protruded from the resin part and directly connectable to a capacitor, which is provided outside the resin part; and
a link member including an embedded part, which is embedded in the resin part, and an exposed part, which is exposed from the resin part, wherein:
the exposed part is formed integrally and contiguously with an embedded part of another semiconductor module,
the coil terminal and the control terminals are provided on different wall surfaces of the resin part, and
the link member forms the capacitor terminal.

14. A semiconductor module for driving a motor, comprising:
a semiconductor chip including switching elements that switches over supply of a current to a coil of the motor in driving the motor;
a land mounting the semiconductor chip thereon;
a resin part sealing the semiconductor chip and embedding the land therein;
a coil terminal protruded from the resin part and directly connectable to the coil; and
control terminals protruded from the resin part and connectable to a printed circuit board, which includes a control circuit for controlling the supply of current to the coil,
wherein the coil terminal and the control terminals are provided on different wall surfaces of the resin part, and
wherein the coil terminal includes:
a droop part protruded from a protrusion surface of the resin unit, which is perpendicular to a face of the semiconductor chip;
an intermediate part bent from the droop part;
a rise part raised from the intermediate part in a direction opposite to a direction, in which the droop part is protruded from the protrusion surface; and
a clamp part bent at a top end of the rise part and formed in a U-shape to clamp the coil therein.

15. The semiconductor module according to claim 14, wherein:
the droop part is protruded from a position displaced from a center of a width of the resin part.

16. A semiconductor module for driving a motor, comprising:
a semiconductor chip including switching elements that switches over supply of a current to a coil of the motor in driving the motor;
a land mounting the semiconductor chip thereon;
a resin part sealing the semiconductor chip and embedding the land therein;
a coil terminal protruded from the resin part and directly connectable to the coil; and
control terminals protruded from the resin part and connectable to a printed circuit board, which includes a control circuit for controlling the supply of current to the coil, wherein:
the coil terminal and the control terminals are provided on different wall surfaces of the resin part,
the land includes a heat dissipation part exposed from the resin part, and
the heat dissipation part is electrically connected to the coil.

17. The semiconductor module according to claim 16, wherein:
the heat dissipation part has a groove, in which the coil is inserted.

18. An electronic circuit-integrated motor device comprising:
a motor case formed in a tubular shape;
a stator fixed to a radially inside wall surface of the motor case and having coils wound thereabout to form a plurality of phases;
a rotor arranged radially inside the stator;
a shaft rotatable with the rotor; and
a semiconductor module including switching elements that switches over supply of a current, which flows in the coil of the plurality of phases in driving the motor,
wherein the semiconductor module comprises:
a semiconductor chip forming the switching elements;
a land mounting the semiconductor chip thereon;
a resin part sealing the semiconductor chip and embedding the land therein;
a coil terminal protruded from the resin part and directly connected to the coil; and
a control terminal protruded from the resin part and connected to a printed circuit board, which includes a control circuit for controlling the supply of current to the coil, wherein the coil terminal and the control terminals are provided on different wall surfaces of the resin part,
wherein:
the semiconductor module is arranged between the motor case and the printed circuit board; and
the coil terminal and the control terminals are protruded from the resin part in opposite directions, and further comprising:

a heat sink provided adjacent to the motor case to surround the shaft and having an outside wall surface inclined relative to the shaft, wherein the semiconductor module is provided on the outside wall surface of the heat sink, and wherein a capacitor is provided radially outside the semiconductor module.

* * * * *